(12) United States Patent
Hill

(10) Patent No.: US 7,330,274 B2
(45) Date of Patent: *Feb. 12, 2008

(54) COMPENSATION FOR GEOMETRIC EFFECTS OF BEAM MISALIGNMENTS IN PLANE MIRROR INTERFEROMETERS

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 220 days.

This patent is subject to a terminal disclaimer.

(21) Appl. No.: 10/437,271

(22) Filed: May 13, 2003

(65) Prior Publication Data

US 2003/0223077 A1 Dec. 4, 2003

Related U.S. Application Data

(60) Provisional application No. 60/378,004, filed on May 13, 2002.

(51) Int. Cl.
*G01B 11/02* (2006.01)
(52) U.S. Cl. ...................................... 356/498; 356/500
(58) Field of Classification Search ........ 356/486–488, 356/492–494, 498–500, 508–510
See application file for complete search history.

(56) References Cited

U.S. PATENT DOCUMENTS

| | | | |
|---|---|---|---|
| 4,790,651 A | 12/1988 | Brown et al. | |
| 5,064,289 A | 11/1991 | Bockman | |
| 5,114,234 A | 5/1992 | Otsuka et al. | |
| 5,151,749 A * | 9/1992 | Tanimoto et al. | 356/620 |
| 5,187,543 A | 2/1993 | Ebert | |
| 5,331,400 A | 7/1994 | Wilkening et al. | |
| 5,363,196 A | 11/1994 | Cameron | |
| 5,408,318 A | 4/1995 | Slater | |
| 5,464,715 A * | 11/1995 | Nishi et al. | 430/22 |
| 5,491,550 A | 2/1996 | Dabbs | |
| 5,638,179 A * | 6/1997 | Masuyuki | 356/603 |
| 5,663,793 A | 9/1997 | de Groot | |
| 5,724,136 A | 3/1998 | Zanoni | |
| 5,757,160 A | 5/1998 | Kreuzer | |
| 5,764,361 A | 6/1998 | Kato et al. | |
| 5,790,253 A * | 8/1998 | Kamiya | 356/500 |
| 5,801,832 A | 9/1998 | Van Den Brink | |
| 6,008,902 A * | 12/1999 | Rinn | 356/486 |
| 6,020,964 A | 2/2000 | Loopstra et al. | |
| 6,046,792 A | 4/2000 | Van Der Werf et al. | |

(Continued)

FOREIGN PATENT DOCUMENTS

JP  7-351078  12/1995

(Continued)

OTHER PUBLICATIONS

Badami, V.G. et al. "Investigation of Nonlinearity in High Accuracy Heterodyne Laser Interferometry." *American Society for Precision Engineering 1997 Proceedings*, 16:pp. 153-166, 1997.

(Continued)

*Primary Examiner*—Patrick Connolly
(74) *Attorney, Agent, or Firm*—Fish & Richardson P.C.

(57) ABSTRACT

Techniques for compensating for geometric effects of beam misalignment in plane mirror interferometers are disclosed.

42 Claims, 11 Drawing Sheets

U.S. PATENT DOCUMENTS

| | | | |
|---|---|---|---|
| 6,057,921 A * | 5/2000 | Yao | 356/500 |
| 6,134,007 A | 10/2000 | Naraki et al. | |
| 6,137,574 A | 10/2000 | Hill | |
| 6,181,420 B1 | 1/2001 | Badami et al. | |
| 6,246,481 B1 | 6/2001 | Hill | |
| 6,252,668 B1 | 6/2001 | Hill | |
| 6,304,318 B1 | 10/2001 | Matsumoto | |
| 6,330,105 B1 | 12/2001 | Rozelle et al. | |
| 6,541,759 B1 | 4/2003 | Hill | |
| 6,700,665 B2 * | 3/2004 | Hill | 356/500 |
| 6,710,884 B2 * | 3/2004 | Hill | 356/498 |
| 6,891,624 B2 * | 5/2005 | Hill | 356/500 |
| 2002/0048026 A1 | 4/2002 | Isshiki et al. | |
| 2002/0089671 A1 | 7/2002 | Hill | |
| 2003/0090675 A1 | 5/2003 | Fujiwara | |
| 2003/0174341 A1 * | 9/2003 | Hill | 356/498 |
| 2003/0210404 A1 * | 11/2003 | Hill | 356/500 |
| 2005/0018206 A1 * | 1/2005 | Hill | 356/498 |
| 2006/0187464 A1 * | 8/2006 | Womack et al. | 356/500 |

FOREIGN PATENT DOCUMENTS

| | | |
|---|---|---|
| JP | 8-117083 | 4/1996 |
| JP | 10 260009 | 9/1998 |

OTHER PUBLICATIONS

Bennett, S.J. "A Double-Passed Michelson Interferometer." *Optics Communications*, 4:6, pp. 428-430, 1972.

Bobroff, Norman. "Recent advances in displacement measuring interferometry." *Meas. Sci. Technol*, 4: pp. 907-926, 1993.

Hines, Brad et al. "Sub-Nanometer Laser Metrology—Some Techniques and Models." *European Southern Observatory, ESO Conference*, pp. 1195-1204, 1991.

Oka, K. et al. "Polarization heterodyne interferometry using another local oscillator beam." *Optics Communications*, 92:pp. 1-5, 1992.

Wu, Chien-Ming. Analytical modeling of the periodic nonlinearity in heterodyne interferometry. *Applied Optics*, 37:28 pp. 6696-6700, 1998.

* cited by examiner

COMPENSATION FOR GEOMETRIC EFFECTS OF BEAM MISALIGNMENTS IN PLANE MIRROR INTERFEROMETERS

CROSS-REFERENCE TO RELATED APPLICATIONS

This application claims priority to Provisional Patent Application No. 60/378,004, entitled "COMPENSATION FOR GEOMETRIC EFFECTS OF BEAM MISALIGNMENTS IN PLANE MIRROR INTERFEROMETERS," to Henry A. Hill, filed on May 13, 2002, the entire contents of which are hereby incorporated by reference.

BACKGROUND

This invention relates to interferometers, e.g., linear and angular displacement measuring and dispersion interferometers, that measure linear and angular displacements of a measurement object such as a mask stage or a wafer stage in a lithography scanner or stepper system, and also interferometers that monitor wavelength and determine intrinsic properties of gases.

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from a reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam-splitter to direct the measurement and reference beams to the measurement and reference objects, respectively, and combine the reflected measurement and reference beams to form overlapping exit measurement and reference beams. The overlapping exit beams form an output beam that subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams.

A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where $v$ is the relative speed of the measurement and reference objects, $\lambda$ is the wavelength of the measurement and reference beams, n is the refractive index of the medium through which the light beams travel, e.g., air or vacuum, and p is the number of passes to the reference and measurement objects. Changes in the phase of the measured interference signal correspond to changes in the relative position of the measurement object, e.g., a change in phase of $2\pi$ corresponds substantially to a distance change L of $\lambda/(2np)$. Distance 2L is a round-trip distance change or the change in distance to and from a stage that includes the measurement object. In other words, the phase $\Phi$, ideally, is directly proportional to L, and can be expressed as.

$$\Phi = 2pkL \cos^2\theta, \qquad (1)$$

for a plane mirror interferometer, e.g., a high stability plane mirror interferometer, where $$k = \frac{2\pi n}{\lambda}$$

and $\theta$ is the orientation of the measurement object with respect to a nominal axis of the interferometer. This axis can be determined from the orientation of the measurement object where $\Phi$ is maximized. Where $\theta$ is small, Eq. (1) can be approximated by $$\Phi = 2pkL(1-\theta^2) \qquad (2)$$

Unfortunately, the observable interference phase, $\tilde{\Phi}$, is not always identically equal to phase $\Phi$. Many interferometers include, for example, non-linearities such as those known as "cyclic errors." The cyclic errors can be expressed as contributions to the observable phase and/or the intensity of the measured interference signal and have a sinusoidal dependence on the change in for example optical path length 2pnL. In particular, a first order cyclic error in phase has for the example a sinusoidal dependence on $(4\pi pnL)/\lambda$ and a second order cyclic error in phase has for the example a sinusoidal dependence on $2(4\pi pnL)/\lambda$. Higher order cyclic errors can also be present as well as sub-harmonic cyclic errors and cyclic errors that have a sinusoidal dependence of other phase parameters of an interferometer system comprising detectors and signal processing electronics.

There are in addition to the cyclic errors, non-cyclic non-linearities or non-cyclic errors. One example of a source of a non-cyclic error is the diffraction of optical beams in the measurement paths of an interferometer. Non-cyclic error due to diffraction has been determined for example by analysis of the behavior of a system such as found in the work of J.-P. Monchalin, M. J. Kelly, J. E. Thomas, N. A. Kurnit, A. Szöke, F. Zernike, P. H. Lee, and A. Javan, "Accurate Laser Wavelength Measurement With A Precision Two-Beam Scanning Michelson Interferometer," *Applied Optics*, 20(5), 736-757, 1981.

A second source of non-cyclic errors is the effect of "beam shearing" of optical beams across interferometer elements and the lateral shearing of reference and measurement beams one with respect to the other. Beam shears can be caused for example by a change in direction of propagation of the input beam to an interferometer or a change in orientation of the object mirror in a double pass plane mirror interferometer such as a differential plane mirror interferometer (DPMI) or a high stability plane mirror interferometer (HSPMI).

Accordingly, due to errors such as the aforementioned cyclic and non-cyclic errors, the observable interference phase typically includes contributions in addition to $\Phi$. Thus, the observable phase is more accurately expressed as $$\tilde{\Phi} = \Phi + \psi + \zeta, \qquad (3)$$

where $\psi$ and $\zeta$ are the contributions due to the cyclic and non-cyclic errors, respectively. The effect of contributions to the observable phase due to cyclic and non-cyclic errors can be reduced by quantifying these errors in each interferometer and correcting subsequent measurements with this data. Different techniques for quantifying cyclic errors are described in commonly owned U.S. Pat. Nos. 6,252,668, 6,246,481, 6,137,574, and U.S. patent application Ser. No. 10/287,898 entitled "INTERFEROMETRIC CYCLIC ERROR COMPENSATION" filed Nov. 5, 2002 by Henry A. Hill, the entire contents each of which are incorporated herein by reference. In order to compensate for these contributions, cyclic error compensating systems and methods can be used to determine a cyclic error function characterizing the cyclic en-or contribution to the observed phase. Examples of apparatus and details of methods that can be used to characterize non-cyclic errors in interferometers and interferometer components are described in U.S. patent application Ser. No. 10/366,587 entitled "CHARACTERIZATION AND COMPENSATION OF NON-CYCLIC ERRORS IN INTERFEROMETRY SYSTEMS," to Henry A. Hill, filed on Feb. 12, 2003, the entire contents of which are incorporated herein by reference.

Assuming any contributions due to cyclic and/or non-cyclic errors are small or otherwise compensated, according to Eq. (2), the observable phase measured by a displacement measuring interferometer should be equal to $2pkL(1-\theta^2)$. This relationship assumes that the optical path difference between the measurement and reference beam is equal to $2pL(1-\theta^2)$ and allows one to readily determine L, a displacement of the measurement object from the interferometer, from the measured phase, provided the orientation of the measurement object is known.

SUMMARY

In certain aspects, the invention is based on the realization that a deviation of one or more of the interferometer beams from a nominal beam path can cause the optical path difference to vary from the optical path difference assumed for Eq. (2). Errors arising from such deviations are referred to as geometric non-cyclic errors. Where such errors arise, using the relationship in Eq. (2) to determine L from the measured phase can provide erroneous results, which can be detrimental in applications demanding a high level of precision. Furthermore, effects of such beam path deviations are heightened where L is comparatively large (e.g., 0.5 m or more) because the contribution of a beam path deviation to the optical path difference typically scales with L.

Accordingly, in certain aspects, the invention features methods for compensating interferometer measurements to account for deviations of beam paths from the nominal beam path. Deviations of interferometer beams paths from the nominal path can be determined while calibrating the interferometer prior to its use and/or during periods where the interferometry system is off-line. This precalibrated information is provided with the interferometry system, and used by the system to correct measurements so that they account for the beam path deviations.

Sources of beam path deviations include imperfections in one or more of the optical components making up the interferometer, imperfections in the measurement object, and instabilities in the interferometer light source that may cause the path of the interferometer input beam to vary. Beam path deviations can be characterized with respect to a nominal path corresponding to a perfectly aligned, defect free system. The nominal path for the measurement beam and measurement beam component of the output beam depends on the angular orientation of the measurement object. In other words, the nominal path is the path for which the optical path difference corresponds identically to $2pL(1-\theta^2)$, where L and $\theta$ are measured with respect to a fixed reference co-ordinate system.

The precalibrated information may be stored as a representation (e.g., a lookup table or a functional representation) in an electronic data storage medium (e.g., a memory chip or a disk), which is provided to the interferometer's end user. A control algorithm that runs the interferometer in its end use application accesses the information from the data storage medium, and compensates the interferometer measurement accordingly.

Compensation may be performed on-line in real time or off-line. Application of the methods may be used to isolate effects of other errors, such as non-cyclic errors due to wavefront errors and beam shear.

Interferometers using techniques disclosed herein may be used in lithography tools and beam writing systems.

Various aspects and features of the invention are summarized below.

In general, in a first aspect, the invention features a method that includes using an interferometer in an interferometry system to produce an output beam including a phase related to an optical path difference between two beam paths, at least one of which contacts a measurement object in the interferometry system, providing precalibrated information that accounts for contributions to the optical path difference caused by a deviation of at least one of the beam paths from a nominal beam path due to an imperfection in the interferometry system, and determining a position of the measurement object with respect to at least one degree of freedom based on information derived from the output beam and the precalibrated information.

Implementations of the method can include one or more of the following features and/or features of other aspect.

The imperfection can include an imperfection in at least one optic of the interferometer (e.g an imperfection in a surface of the optic or a bulk imperfection in the optic). Alternatively, or additionally, the imperfection can include an imperfection in an optic of the measurement object. In some embodiments, the imperfection can include an imperfection in a light source that causes an input beam derived from the light source to deviate from an input beam path to the interferometer.

The precalibrated information can be parameterized in terms of at least one of (e.g., in terms at least two of or in terms of all three of) an angular orientation of the measurement object relative to the interferometer, a distance between the measurement object and the interferometer, and a direction of an input beam to the interferometer. The precalibrated information can be stored as a representation in an electronic storage medium (e.g., including a lookup table or a functional representation).

The determined position of the measurement object with respect to at least one degree of freedom can be related to a displacement of the measurement object relative to the interferometer (e.g., can be the displacement of the measurement object relative to the interferometer) and/or can be related to an angular orientation of the measurement object (e.g., can be the angular orientation of the measurement object).

Determining the position of the measurement object can include measuring a phase of the output beam and relating the phase to the position of the measurement object based on one or more values derived from the predetermined information. The values derived from the predetermined information can be selected based on the phase, on an angular orientation of the measurement object, and/or on a path of an input beam derived from the light source to the interferometer relative to the nominal path. In some embodiments, the method can include monitoring deviations of the input beam path from the nominal path.

A relationship between the phase, $\Phi$, and the optical path difference can be expressed by the equation $$\Phi = 2pkL\zeta(1-(\theta-\eta)^2),$$

wherein p is an integer, k is a wavenumber, L is a relative distance between the interferometer and the measurement object, $\theta$ is an angular orientation of the measurement object with respect to the interferometer, and $\zeta$ and $\eta$ are terms that depend on the deviation of at least one of the beam paths from the nominal beam path.

Using the interferometer to produce the output beam can include producing the output beam as the measurement object is moved relative to the interferometer, and determining the position of the measurement object can include monitoring the position of the measurement object during the relative movement. Using the interferometer to produce the output beam can include separating an input beam into at least two beams, directing the two beam along the two beam paths, and recombining the two beams after at least one of the beams (e.g., both of the beams) contacts the measurement object. In embodiments where both of the beams contact the measurement object, the optical path difference can be related to an angular orientation of the measurement object with respect to the interferometer.

In general, in another aspect, the invention features a method that includes using an interferometer to produce an output beam including a phase related to an optical path difference between two beam paths, at least one of which contacts a measurement object, providing precalibrated information that accounts for contributions to the optical path difference caused by a deviation of at least one of the beam paths from a nominal beam path due to an imperfection in at least one of a light source for the interferometer, the interferometer, or the measurement object, and determining a displacement of the measurement object relative to the interferometer based on the precalibrated information and information derived from the output beam.

Implementations of the method can include one or more of the features of other aspects.

In general, in a further aspect, the invention features a method that includes correcting interferometric measurements made by an interferometry system based on precalibrated information that accounts for contributions to an optical path difference caused by a deviation of at least one beam path from a nominal beam path due to an imperfection in the interferometry system.

Implementations of the method can include one or more of the features of other aspects.

In general, in another aspect, the invention features a method that includes calibrating an interferometry system by determining information that accounts for contributions to an optical path difference caused by a deviation of at least one beam path from a nominal beam path due to an imperfection in the interferometry system.

Implementations of the method can include one or more of the following features and/or features of other aspects.

The calibrating can include monitoring changes in a direction of one or more intermediate beams in the interferometry system while varying the optical path difference. Varying of the optical path difference can include displacing a measurement object relative to an interferometer in the interferometry system and/or changing an angular orientation of a measurement object relative to an interferometer in the interferometry system.

In general, in another aspect, the invention features an apparatus that includes an interferometer configured to produce an output beam including a phase related to an optical path difference between two beam paths, at least one of which contacts a measurement object, and an electronic controller coupled to the interferometer, wherein during operation the electronic controller determines a position of the measurement object with respect to at least one degree of freedom based on information derived from the output beam and precalibrated information that accounts for contributions to the optical path difference caused by a deviation of at least one of the beam paths from a nominal beam path due to an imperfection in at least one of a light source for the interferometer, the interferometer, or the measurement object.

Embodiments of the apparatus can include one or more of the features of other aspects, and/or can be configured to implement the methods disclosed herein.

In general, in a further aspect, the invention features an apparatus including an electronic storage medium storing precalibrated information that accounts for contributions to the optical path difference caused by a deviation of at least one of the beam paths from a nominal beam path due to an imperfection in at least one of a light source for the interferometer, the interferometer, or the measurement object.

Embodiments of the apparatus can include one or more of the features of other aspects, and/or can be configured to implement the methods disclosed herein.

In another aspect, the invention features a lithography system for use in fabricating integrated circuits on a wafer, the system including a stage for supporting the wafer, an illumination system for imaging spatially patterned radiation onto the wafer, a positioning system for adjusting the position of the stage relative to the imaged radiation, and a foregoing apparatus for monitoring the position of the wafer relative to the imaged radiation.

In another aspect, the invention features a lithography system for use in fabricating integrated circuits on a wafer, the system including a stage for supporting the wafer, and an illumination system including a radiation source, a mask, a positioning system, a lens assembly, and a foregoing apparatus, wherein during operation the source directs radiation through the mask to produce spatially patterned radiation, the positioning system adjusts the position of the mask relative to the radiation from the source, the lens assembly images the spatially patterned radiation onto the wafer, and the apparatus monitors the position of the mask relative to the radiation from the source.

In a further aspect, the invention features a beam writing system for use in fabricating a lithography mask, the system including a source providing a write beam to pattern a substrate, a stage supporting the substrate, a beam directing assembly for delivering the write beam to the substrate, a positioning system for positioning the stage and beam directing assembly relative one another, and a foregoing apparatus for monitoring the position of the stage relative to the beam directing assembly.

In another aspect, the invention features a lithography method for use in fabricating integrated circuits on a wafer, the method including supporting the wafer on a moveable stage, imaging spatially patterned radiation onto the wafer, adjusting the position of the stage, and monitoring the position of the stage using the a foregoing method.

In a further aspect, the invention features a lithography method for use in the fabrication of integrated circuits including directing input radiation through a mask to produce spatially patterned radiation, positioning the mask relative to the input radiation, monitoring the position of the mask relative to the input radiation using a foregoing method, and imaging the spatially patterned radiation onto a wafer.

In yet another aspect, the invention features a lithography method for fabricating integrated circuits on a wafer including positioning a first component of a lithography system relative to a second component of a lithography system to expose the wafer to spatially patterned radiation, and monitoring the position of the first component relative to the second component using a foregoing method.

In a further aspect, the invention features a method for fabricating integrated circuits, the method including a foregoing lithography method.

In another aspect, the invention features a method for fabricating integrated circuits, the method including using a foregoing lithography system.

In yet another aspect, the invention features a method for fabricating a lithography mask, the method including directing a write beam to a substrate to pattern the substrate, positioning the substrate relative to the write beam, and monitoring the position of the substrate relative to the write beam using the a foregoing interferometry method.

Embodiments of the invention may include one or more of the following advantages.

Characterizing beam path deviations in interferometers and/or interferometer components using the techniques disclosed herein can be used to improve interferometer accuracy in end-use applications. Accuracy improvement comes from compensating for the contribution of beam path deviations to the optical path difference when determining a degree of freedom (e.g., a displacement or angular orientation) of a measurement object from the interference phase. This also can allow for the use of interferometer and interferometer components in high precision applications where imperfections causing beam path deviations would otherwise render the interferometer and/or components too inaccurate. Accordingly, interferometers and/or components can be used in applications that would otherwise require higher quality components to provide a desired level of accuracy. Because lesser quality components are typically cheaper than high quality counterparts, the techniques can provide a cost savings.

Unless otherwise defined, all technical and scientific terms used herein have the same meaning as commonly understood by one of ordinary skill in the art to which this invention belongs. In case of conflict with publications, patent applications, patents, and other references mentioned incorporated herein by reference, the present specification, including definitions, will control.

Other features, objects, and advantages of the invention will be apparent from the following detailed description.

DESCRIPTION OF DRAWINGS

Like reference symbols in the various drawings indicate like elements.

DETAILED DESCRIPTION

Figure 1:
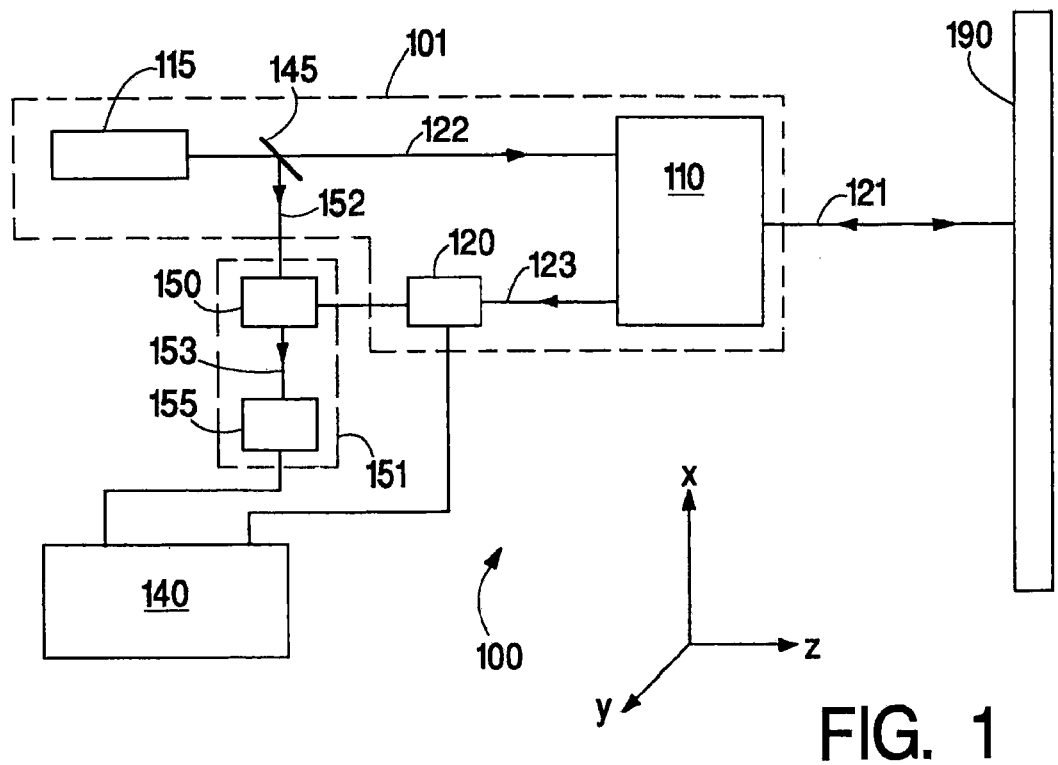
FIG. 1 is a schematic diagram of an embodiment of an interferometry system.

Referring to FIG. 1, an interferometry system 100 includes interferometer subsystems 101 and 151 which are respectively configured to monitor a displacement of a plane mirror measurement object 190 and a beam propagation direction. Subsystem 101 includes an interferometer 110 positioned to receive an input beam 122 from a source 115. Interferometer 110 splits input beam 122 into a measurement beam 121 and a reference beam (not shown), directs measurement beam 121 and the reference beam along different paths, and recombines them to form an output beam 123. Interferometer 110 directs measurement beam 121 to reflect from measurement object 190. Although measurement beam 121 is depicted as making a single pass between measurement object 190 and interferometer 110, in many embodiments it makes multiple passes to the measurement object. Output beam 123 impinges on a detector 120, which detects intensity variations in a polarization component of output beam 123. Detector 120 communicates the time-varying intensity variations to an electronic controller 140 as an interference signal from which electronic controller 140 extracts an interference phase. The interference phase is related to the optical path difference between measurement beam 121 and the reference beam. Subsequently, electronic processor 140 determines a displacement of measurement object 190 relative to interferometer 110 based on a known relationship between the phase, the optical path difference and the relative displacement.

Subsystem 151 includes an angle interferometer 150 and a detector 155. A beam-splitter 145 directs a portion 152 of the beam from light source 115 towards angle interferometer 150, which generates an output beam 153 having an interference phase related to the direction of input beam 122. Detector 155 monitors the intensity of a polarization component of output beam 153 and communicates an interference signal related to the output beam intensity to electronic controller 140. Electronic controller 140 then extracts an interference phase from the interference signal and determines deviations of the propagation direction of input beam 122 from variations of the interference phase.

Figure 2:
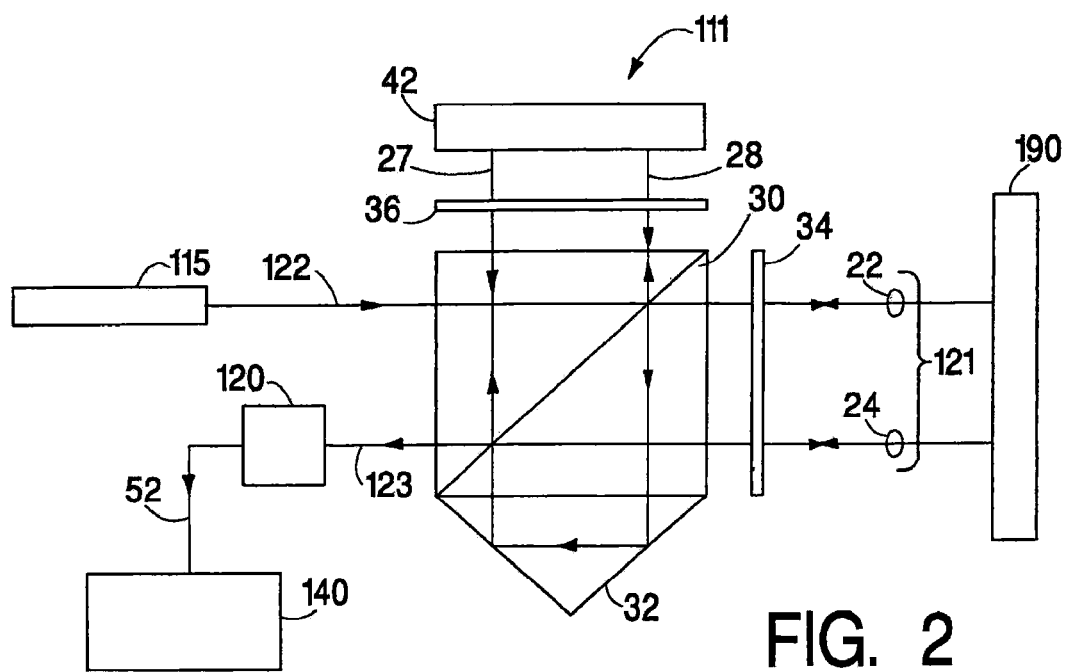
FIG. 2 is a schematic diagram of a high stability plane mirror interferometer (HSPMI).
Figure 3:
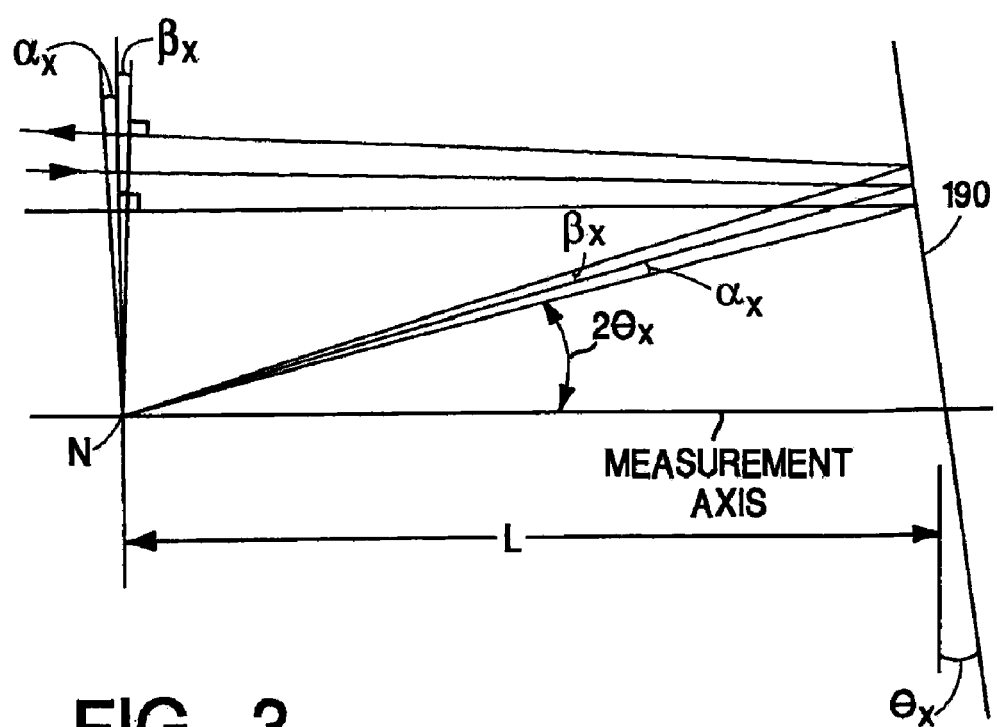
FIG. 3 is a schematic diagram showing beam path deviations for beams in the HSPMI of FIG. 2.

In FIGS. 1-3, reference is made to a Cartesian co-ordinate system shown in FIG. 1.

Optimally, the paths of input beam 122, measurement beam 121, and the components of output beam 123 coincide with a nominal beam path. The nominal path corresponds the path of the beam where the input beam has a fixed orientation relative to a preferred measurement axis of interferometer 110 and the optics making up interferometer 110 and plane mirror measurement object 190 are perfect. The nominal path of the measurement beam (and the measurement beam component of the output beam) is determined according to the orientation of mirror 190 with respect to the interferometer measurement axis, which is parallel to the z-axis. Accordingly, rather than there being one nominal path for the measurement beam, there is a different nominal path for each orientation of the measurement object at each displacement of the measurement object relative to the interferometer.

Due to imperfections in one or more of the optical components (e.g., deviations in the flatness of an optical surface or refractive index variations of a component) or instabilities or misalignment of source 115, the path of input beam 122, measurement beam 121, and/or the components of output beam 123 may deviate from the nominal beam path. These deviations can cause the optical path difference between the measurement beam and reference beam to vary from the optical path difference implied by a relationship such as given by Eq. (2) above for a plane mirror interferometer. System 100 accounts for contributions to the optical path difference caused by these deviations by accessing a lookup table that provides correction data parameterized as a function of one or more measurable system parameters, and determines the displacement of the measurement object relative to interferometer 110 based on a corrected optical path difference. Determination of the correct optical path difference is described in detail for a specific interferometer below.

In some embodiments, interferometer 110 is a high stability plane mirror interferometer (HSPMI). Referring to FIG. 2, an HSPMI 111 includes a polarization beam-splitter 30, a retroreflector 32, quarter wave phase retardation plates 34 and 36, and a plane mirror reference object 42. Input beam 122 is a two-component beam. The two components have different frequencies and are orthogonally plane polarized. The different frequencies can be produced in source 115, for example, by laser Zeeman splitting, by acousto-optical modulation, or internal to the laser using birefringent elements or the like. HSPMI 111 splits input beam 122 into two components. One component, shown as first and second pass measurement beams 22 and 24, reflects from measurement object 190 twice before exiting HSPMI 111. The other component, shown by first and second pass reference beams 28 and 27, reflect from reference mirror 42 twice before exiting HSPMI 111. The exiting beam components overlap and form output beam 123.

An electrical interference signal 52 is generated by the detection of output beam 123 in detector 120. Detector 120 includes a polarizer to mix the reference and measurement beam components of output beam 123 with respect to polarization. Electrical interference signal 52 contains a heterodyne signal having a heterodyne phase $\Phi$.

Reference is made to FIG. 3 in discussing the relationship between a physical displacement L to be measured by HSMPI 111 and the measured phase $\Phi$ of the heterodyne signal from HSPMI 111. Phase $\Phi$ is given to a good approximation by the Eq.

$$\frac{\Phi}{k} = L \begin{cases} \cos\theta_x \cos\theta_y \frac{[1 + \cos 2(\theta_x + \alpha_x)\cos 2(\theta_y + \alpha_y)]}{\cos(\theta_x + \alpha_x)\cos(\theta_y + \alpha_y)} + \\ \cos\theta_x \cos\theta_y \frac{[1 + \cos 2(\theta_x + \alpha_x + \beta_x)\cos 2(\theta_y + \alpha_y + \beta_y)]}{\cos(\theta_x + \alpha_x + \beta_x)\cos(\theta_y + \alpha_y + \beta_y)} + \\ \frac{1}{2}(\beta_x + \gamma_x)(4\theta_x + 4\alpha_x + 2\beta_x) + \\ \frac{1}{2}(\beta_y + \gamma_y)(4\theta_y + 4\alpha_y + 2\beta_y) \end{cases} \quad (4)$$

where L is the distance between point N, the conjugate of the nodal point of retroreflector 32 as seen through polarization beam-splitter 30, and object mirror 190 along a measurement axis as defined for interferometer 111; k is a wavenumber corresponding to wavelength $\lambda$ of source 115; $\theta_x$ and $\theta_y$ are the rotations of object mirror 190 about x and y axes, respectively; $\alpha_x$ and $\alpha_y$ are deviations in the direction of the input beam with respect to the interferometer measurement axis in the x–z and y–z planes, respectively; $\beta_x$ and $\beta_y$ are deviations in the direction of the component of second pass measurement beam 24 propagating toward object mirror 190 with respect to the direction of propagation of the component of the first pass measurement beam 22 propagating toward HSMPI 111 in the x–z and y–z planes, respectively, with $\alpha_x = \alpha_y = 0$; and $\gamma_x$ and $\gamma_y$ are deviations in the direction of the measurement beam component of output beam 123 with respect to the direction of component of the second pass measurement beam 24 propagating toward HSMPI 111 in the x–z and y–z planes, respectively, with $\alpha_x = \alpha_y = 0$ and $\beta_x = \beta_y = 0$. Note that although $\beta_x$ and $\beta_y$ are presented as deviations in the direction of the component of second pass measurement beam with respect to the direction of the first pass beam, equivalently, these deviations can be expressed as deviations of the first and second pass beams from a nominal path.

The location of the conjugate of the nodal point of retroreflector 32 is displaced from the conjugate of the apex of retroreflector 32 as seen through polarization beam-splitter 30 depending on the magnitude of the index of refraction of polarization beam-splitter 30 and retroreflector 32.

The differences $\delta_x$ and $\delta_y$ in the directions of propagation of reference and measurement beam components of output beam 123 in the x–z and y–z planes, respectively, are $$\delta_x = \beta_x + \gamma_x, \quad (5)$$

$$\delta_y = \beta_y + \gamma_y. \quad (6)$$

Eq. (4) may be expanded in a power series as $$\frac{\Phi}{4kL} = \begin{bmatrix} 1 - (\theta_x^2 + \theta_y^2) - \theta_x\left(\alpha_x + \frac{\beta_x}{2} - \frac{\delta_x}{2}\right) - \\ \theta_y\left(\alpha_y + \frac{\beta_y}{2} - \frac{\delta_y}{2}\right) - \frac{1}{2}(\alpha_x^2 + \alpha_y^2) - \\ \frac{1}{2}(\alpha_x\beta_x + \alpha_y\beta_y) + \frac{1}{2}(\alpha_x\delta_x + \alpha_y\delta_y) + \\ \frac{1}{4}(\beta_x\delta_x + \beta_y\delta_x) - \frac{1}{4}(\beta_x^2 + \beta_y^2) + \ldots \end{bmatrix} \quad (7)$$

wherein the leading terms have been retained up through quadratic terms. In order to make the contributions of the deviations from the nominal path more easily identified, Eq. (7) may be rewritten as $$\frac{\Phi}{4kL} = \begin{bmatrix} 1 - \left[\theta_x + \frac{1}{2}\left(\alpha_x + \frac{\beta_x}{2} - \frac{\delta_x}{2}\right)\right]^2 - \left[\theta_y + \frac{1}{2}\left(\alpha_y + \frac{\beta_y}{2} - \frac{\delta_y}{2}\right)\right]^2 - \\ \frac{1}{4}\left(\alpha_x + \frac{\beta_x}{2} - \frac{\delta_x}{2}\right)^2 - \frac{1}{4}\left(\alpha_y + \frac{\beta_y}{2} - \frac{\delta_y}{2}\right)^2 - \\ \frac{1}{8}(\beta_x^2 + \beta_y^2) + \frac{1}{8}(\delta_x^2 + \delta_y^2) \ldots \end{bmatrix}. \quad (8)$$

According to Eq. (8), the effects of the deviations are equivalent to change the directions of the effective measurement axis in the x–z and y–z planes by $\eta_x$ and $\eta_y$, respectively, with $$\eta_x = -\frac{1}{2}\left(\alpha_x + \frac{\beta_x}{2} - \frac{\delta_x}{2}\right), \quad (9)$$

$$\eta_y = -\frac{1}{2}\left(\alpha_y + \frac{\beta_y}{2} - \frac{\delta_y}{2}\right), \quad (10)$$

and to change the effective scale or equivalent wavelength by a factor $\zeta$ where $$\zeta = 1 - \frac{1}{4}\left(\alpha_x + \frac{\beta_x}{2} - \frac{\delta_x}{2}\right)^2 - \frac{1}{4}\left(\alpha_y + \frac{\beta_y}{2} - \frac{\delta_y}{2}\right)^2 - \\ \frac{1}{8}(\beta_x^2 + \beta_y^2) + \frac{1}{8}(\delta_x^2 + \delta_y^2) \ldots . \quad (11)$$

Thus, to account for contributions to the optical path difference due to deviations of the input and/or measurement beam paths from a nominal path, Eq. (2) can be re-expressed as $$\Phi = 2pkL\zeta[1-(\theta_x-\eta_x)^2-(\theta_y-\eta_y)^2], \quad (12)$$

where terms are retained up to quadratic order.

Note that while errors $\delta_x$ and $\delta_y$ may effect the magnitude of the heterodyne signal of signal 52 because these errors are related to the extent to which the measurement and reference beam components in the output beam overlap, the magnitude of the heterodyne signal alone may not be an accurate indication of beam path deviations. This is because although $\delta_x$ and $\delta_y$ may be substantially zero, other components of $\zeta$, $\eta_x$ and $\eta_y$, may still contribute to the optical path difference.

Deviations $\alpha_x$ and $\alpha_y$ are typically a function of the stability and alignment of source 115 and a respective beam system. Angle interferometer 150 (shown in FIG. 1) provides a measure of $\alpha_x$, while a similar angular displacement interferometer (not shown) oriented orthogonally to angle interferometer 150 can provide a measure of $\alpha_y$. In embodiments where source 115 and beam delivery system are sufficiently stable, interferometry system 100 need not include subsystem 151, and $\alpha_x$ and $\alpha_y$ can be re-calibrated as necessary during periodic system maintenance.

Referring to FIG. 4-FIG. 8, one example of an angle interferometer is interferometer 700 which makes angle measurements in one plane of the average direction of propagation of beam 712 relative to a predefined optical axis. Angle interferometer 700 includes beam-shearing assembly generally shown at element numeral 830, analyzer 840, lens 846, detector 860, and electronic processor 870. For heterodyne interferometry, input beam 712 includes two orthogonally polarized optical beam components having a difference in frequencies of $f_1$. The planes of polarization of the two orthogonally polarized components are parallel and orthogonal to the plane of FIG. 4, respectively.

Figure 4:
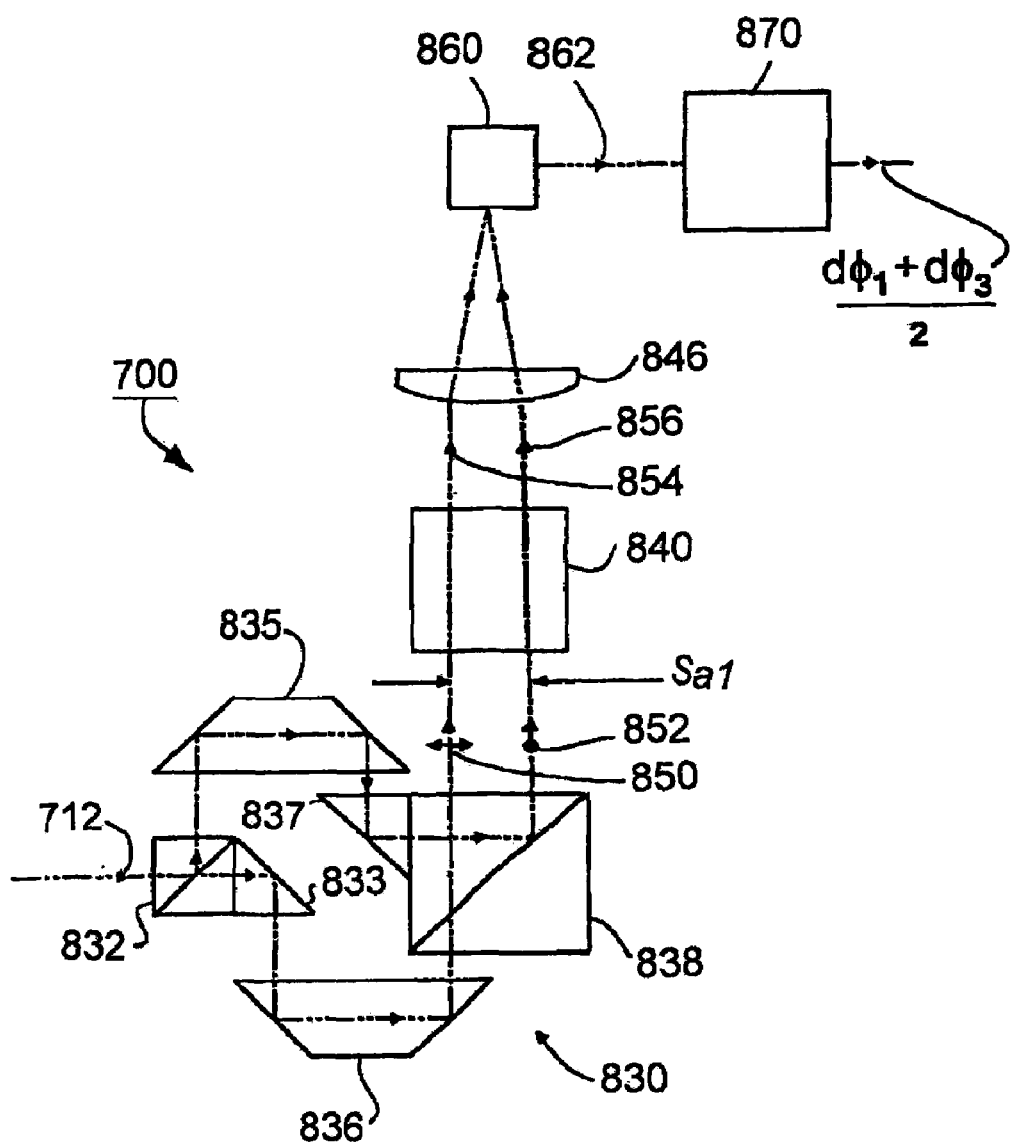
FIG. 4 is a schematic diagram of an embodiment of an angular displacement interferometer.

Beam-shearing assembly 830 introduces a lateral shear $S_{\alpha 1}$ between the two orthogonally polarized beams 850 and 852, respectively (see FIG. 4). A portion of each of the spatially sheared output beams 850 and 852 are transmitted by analyzer 840 as components 854 and 856, respectively. Analyzer 840 is orientated so that beam components 854 and 856 are both polarized in a common plane orientated at 45 degrees to the plane of FIG. 4.

Next, beam components 854 and 856 are incident on lens 846 wherein lens 846 focuses beam components 854 and 856 to spots on detector 860 to be detected preferably by a quantum photon detector to generate electrical interference signal 862 or heterodyne signal $s_1$. The spots substantially overlap. Heterodyne signal $s_1$ is transmitted to electronic processor 870 for determination of the heterodyne phase of signal $s_1$ and a corresponding average direction of propagation of beam 712 in the plane of FIG. 4.

Beam-shearing assembly 830 includes polarizing beam-splitters 832 and 838, right angle prisms 833 and 837, and truncated Porro prisms 835 and 836. The component of beam 712 polarized in the plane of FIG. 4 is transmitted by polarizing beam-splitter 832, reflected by right angle prism 833, redirected by truncated Porro prism 836, and reflected by polarizing beam-splitter 838 as beam 850. The component of beam 712 polarized orthogonal to the plane of FIG. 4 is reflected by polarizing beam-splitter 832, redirected by truncated Porro prism 835, reflected by right angle prism 837, and transmitted by polarizing beam-splitter 838 as beam 852.

Note that the optical path in glass for each of beams 854 and 856 through beam-shearing assembly 830 and analyzer 840 are preferably the same. This feature of the apparatus design of the first embodiment produces a high stability interferometer system with respect to changes in temperature.

Heterodyne signal $s_1$ may be written as $$s_1 = A_1 \cos(\omega_1 t + \phi_1 + \zeta_1) \quad (13)$$

where $$\phi_1 = 2k_1 n[d_1 \cos\theta_1' + d_2 \cos\theta_2' - d_3 \cos\theta_3' - d_4 \cos\theta_4'], \quad (14)$$

Figure 5:
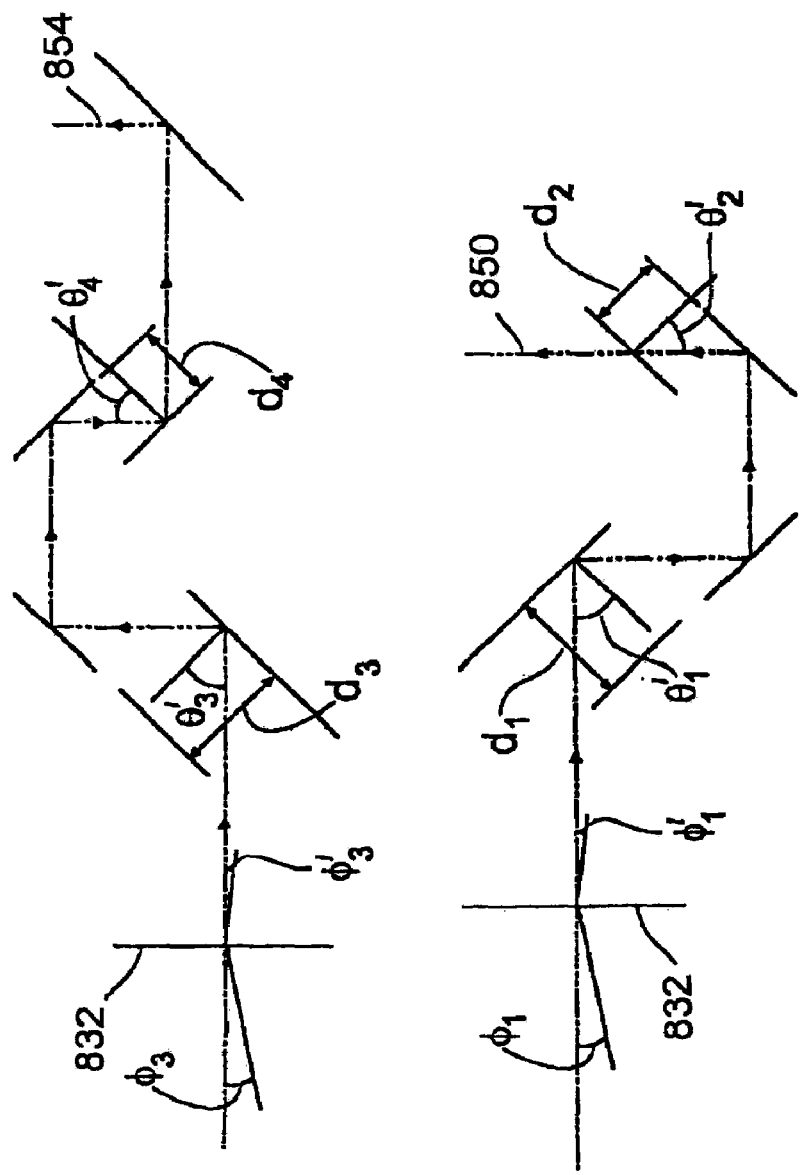
FIG. 5 is a schematic diagram showing the path of a beam through portions of the angular displacement interferometer shown in FIG. 4.

$\omega_1 = 2\pi f_1$, $\zeta_1$ is an offset phase not associated with phase $\phi_1$, $k_1 = 2\pi/\lambda_1$ is the wave length of input beam 712, $\theta_1'$ and $\theta_2'$ are angles of incidence of beam 850 at right angle prism 833 and at the polarizing beam-splitter 838, respectively, $\theta_3'$ and $\theta_4'$ are angles of incidence of beam 852 at polarizing beam-splitter 832 and at right angle prism 837, respectively, and $d_1$, $d_2$, $d_3$, and $d_4$ are defined in FIG. 5. It has been assumed in Eq. (14) for the purposes of demonstrating the features of the present invention in a simple fashion without departing from the scope and spirit of the present invention that all of the optical paths in beam-shearing assembly 30 have the same index of refraction. For a non-limiting example of $d_1 = d_3$, $d_2 = d_4$, $\theta_1' + \theta_2' = \pi/2$, and $\theta_3' + \theta_4' = \pi/2$, Eq. (14) reduces to the simpler expression for $\phi_1$, $$\varphi_1 = 2^{1/2} k_1 n \begin{bmatrix} (d_1 - d_2)[\cos(\theta_1' + \pi/4) + \cos(\theta_4' + \pi/4)] + \\ (d_1 + d_2)[\sin(\theta_1' + \pi/4) - \sin(\theta_4' + \pi/4)] \end{bmatrix}. \quad (15)$$

Lateral shear $S_{\alpha 1}$ is related to properties of beam-shearing assembly 830 according to the Eq.

$$S_{a1} = 2 \begin{bmatrix} (d_1\sin\theta_1' - d_2\sin\theta_2')\sec\phi_1'\cos\phi_1 + \\ (d_3\sin\theta_3' - d_4\sin\theta_4')\sec\phi_3'\cos\phi_3 \end{bmatrix} \quad (16)$$

where $\phi_1$ and $\phi_1'$ are the angles of incidence and refraction of beam 850 at entrance facet of polarizing beam-splitter 832 and $\phi_3$ and $\phi_3'$ are the angles of incidence and refraction of beam 852 at entrance facet of polarizing beam-splitter 832 (see FIG. 5). For the non-limiting example, $$S_{a1} = 2^{1/2} \left\{ (d_1 - d_2) \begin{bmatrix} \sin(\theta_1' + \pi/2)\sec\phi_1'\cos\phi_1 + \\ \sin(\theta_4' + \pi/2)\sec\phi_3'\cos\phi_3 \end{bmatrix} + (d_1 + d_2) \begin{bmatrix} \sin(\theta_1' - \pi/2)\sec\phi_1'\cos\phi_1 - \\ \sin(\theta_4' - \pi/2)\sec\phi_3'\cos\phi_3 \end{bmatrix} \right\} \quad (17)$$

The expression given for $S_{\alpha 1}$ by Eqs. (16) and (17) represent the primary mechanism used for generation of the beam shear. However, there are other mechanisms for introducing a beam shear such as associated with angle of incidence dependent phase shifts (e.g., Goos-Hänchen effect).

Figure 6:
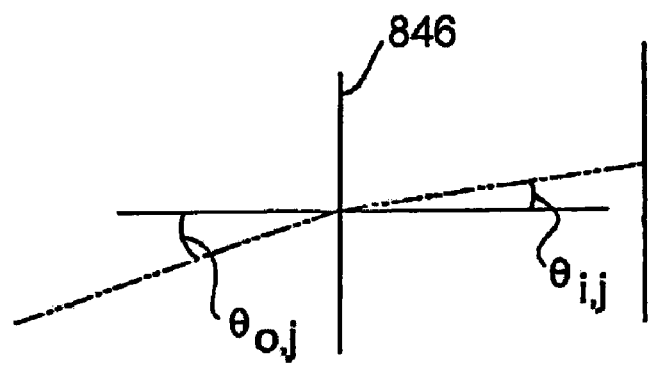
FIG. 6 and FIG. 7 are schematic diagrams showing the path of a beam through other portions of the angular displacement interferometer shown in FIG. 4.
Figure 7:
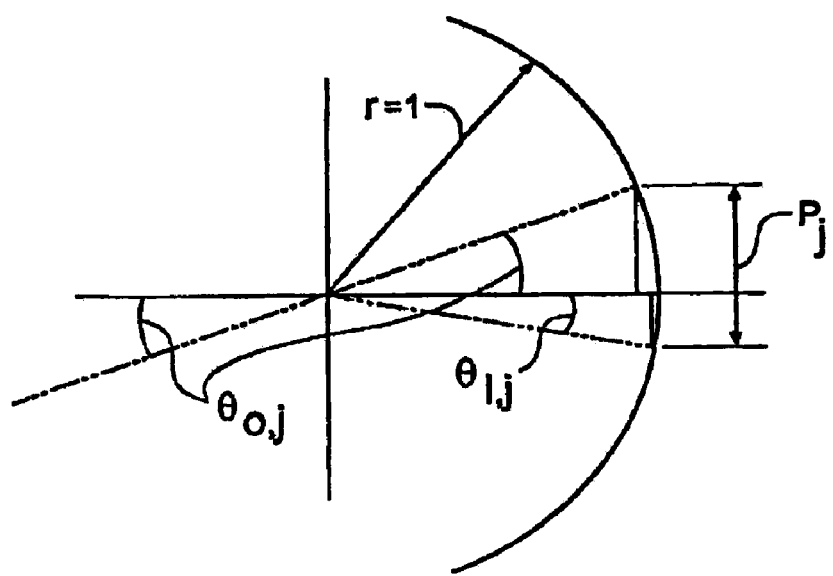

Amplitude $A_1$ is proportional to a good approximation to a Fourier component of the Fourier transform of $|h(p_1)|^2$, i.e., $$A_1 \propto \int |h(p_1)|^2 \cos[4k_1 p_1 S_1] dp_1 \quad (18)$$

where $h(p_1)$ is the Fourier transform of the amplitude of one of the beams 854 or 856 at lens 846 multiplied by the pupil function of lens 846, $$p_j = \sin\theta_{o,j} + \sin\theta_{i,j}, \; j = 1, 2 \ldots, \quad (19)$$

and the definition of $\theta_{o,j}$ and $\theta_{i,j}$ are shown in FIG. 6. Angles $\theta_{o,j}$ and $\theta_{i,j}$ are conjugate angles of principle rays of beam j in the object and image space of lens 846. The definition of $p_j$ is shown in FIG. 7.

It is evident from Eqs. (14) and (15) that the resolution of phase $\phi_1$ in terms of a change in a direction of an optical beam is increased as the length $2^{3/2}(d_1-d_2)$ is increased. However, the usable range for $2^{3/2}(d_1-d_2)$ is defined by the spatial frequency bandwidth of the Fourier transform of $|h(p^1)|^2$ as shown by Eq. (18).

The optimum value for $2^{3/2}(d_1-d_2)$ is generally equal to approximately one half a characteristic spatial dimension of a beam transmitted by a respective pupil. Consider, for example, the case of a rectangular pupil of dimension b in the plane of FIG. 4 for both beam 854 and beam 856 at lens 846 and the amplitudes of beams 854 and 856 being uniform across respective pupils. For this case, $|h(p_1)|^2$ is a sinc function squared, i.e., $(\sin x/x)^2$, and the Fourier transform of $|h(p_1)|^2$ is a triangle function, $\Lambda$. Triangle function, $\Lambda$, has a maximum value of 1 for $2^{3/2}(d_1-d_2)=0$ and has a value of 0 for $2^{3/2}(d_1-d_2) \geq b$. Therefore, amplitude $A_1 = 0$ for $2^{3/2}(d_1-d_2) \geq b$ and the resolution of phase $\phi_1$ in terms of a change in a direction of an optical beam is 0 for $2^{3/2}(d_1-d_2)=0$. Thus the optimum value for $2^{3/2}(d_1-d_2)$ is in this case approximately b/2. The actual optimum value for $2^{3/2}(d_1-d_2)$ will depend on the criterion used to define an optimum operating condition with respect to a signal-to-noise ratio, for example. For the case where the components of beam 712 have Gaussian intensity profiles, the optimum value for $2^{3/2}(d_1-d_2)$ will be approximately w where w is the radius at which the intensity of beam 712 has a value equal to 1/e of the intensity at beam 712 at its center.

For an example of a beam having a Gaussian intensity profile with $2w=5.0$ mm, $\theta_1=45$ degrees, and $\lambda_1=633$ nm, the sensitivity of the phase $\phi_1$ to changes in $d\phi_1$ and $d\phi_3$ expressed in differential form is given by the Eq.

$$d\varphi_1 = k_1 w \left[\frac{d\phi_1 + d\phi_3}{2}\right] \quad (20)$$
$$= -2.5 \times 10^4 \left[\frac{d\phi_1 + d\phi_3}{2}\right].$$

Note, as evident from Eq. (20), that the sensitivity of the change in phase $\phi_1$ with respect to changes in angles $d\phi_1$ and $d\phi_3$ is independent of the index of refraction n. This is an important property of the first embodiment of the angle interferometer. In particular, the sensitivity of the change in phase $\phi_1$ with respect to changes in angles $d\phi_1$ and $d\phi_3$ has a sensitivity to temperature changes that is independent in first order to thermal induced changes in the refractive index of the optical elements of beam-shearing assembly 830 and only dependent on thermal coefficients of expansion of the optical elements of beam-shearing assembly 830. The thermal coefficients of the elements of beam-shearing assembly 830 can be selected to be less than $\leq 0.5$ ppm/° C. For similar reasons, the zero value of $\phi_1$ also exhibits a corresponding low sensitivity to changes in temperature of beam-shearing assembly 830.

The two primary quantities that place restrictions on the range of average value $[d\phi_1+d\phi_3]/2$ that can be accommodated by the first embodiment are the magnitude of the difference $[d\phi_1-d\phi_3]/2$ and the size of the sensitive area of detector 860. The amplitude of the heterodyne signal will be reduced by a factor of approximately 2 when $$wk_1 \left[\frac{[d\phi_1 - d\phi_3]}{2}\right] \approx 1.$$

The higher terms in $d\phi_1$ and $d\phi_3$ that are omitted in Eq. (20) can be easily determined from Eq. (12) if required for a particular end use application.

Figure 8:
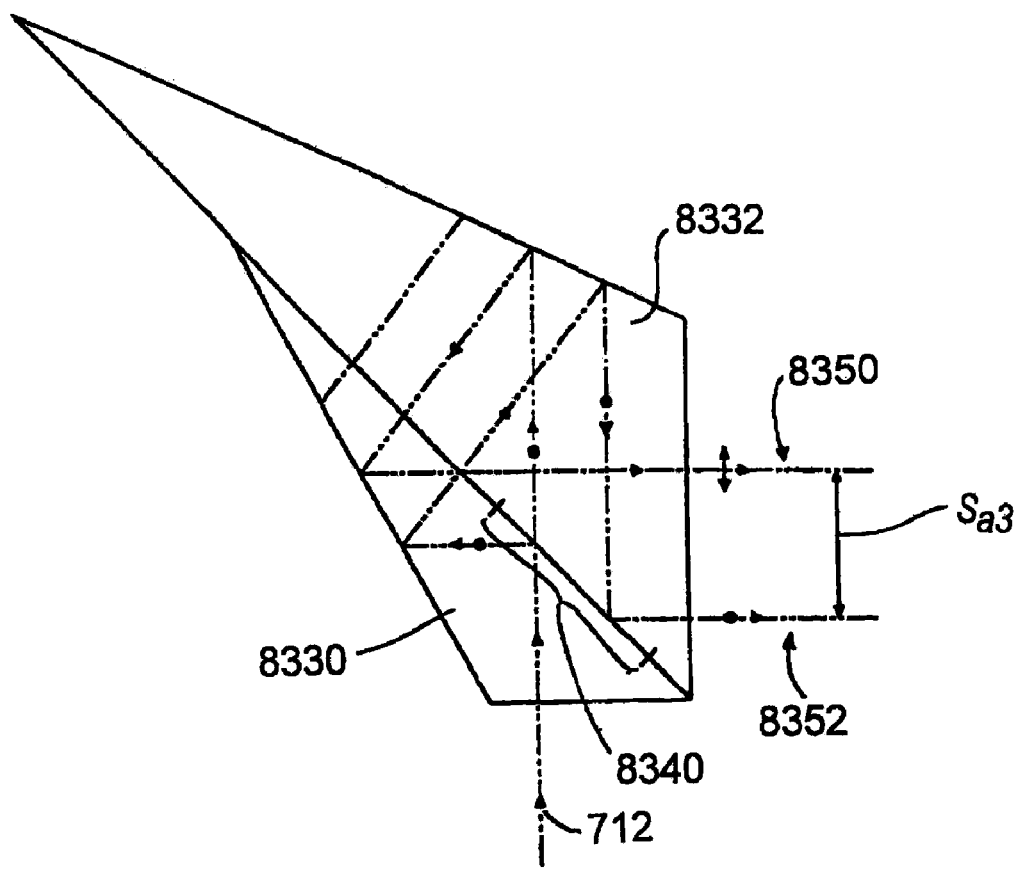
FIG. 8 is a schematic diagram of an embodiment of a beam shearing assembly.

Another embodiment of beam-shearing assembly 830 is shown diagrammatically in FIG. 8 and includes two prisms 8330 and 8332 and polarization beam-splitter interface 8340. A first component of input beam 712 is transmitted twice by polarization beam-splitter interface 8340 and reflected by facets of prisms 8330 and 8332 to form output beam 8350. A second component of input beam 712 is reflected twice by polarization beam-splitter interface 8340 and reflected by facets of prisms 8330 and 8332 to form beams 8350 and 8352.

The two prisms 8330 and 8332 and polarization beam-splitter interface 8340 exhibit properties the same as a Penta prism with respect to relationship of the direction of propagation of beam 712 and the directions of propagation for beams 8350 and 8352. Prisms 8330 and 8332 are preferably isomorphic with relative sizes selected to introduce a beam shear $S_{\alpha 3}$ between beams 8350 and 8352. The optical paths in refractive media are substantially the same for beam 8350 and 8352. The remaining descriptions of beams 8350 and 8352 are the same as the corresponding portion of the descriptions given for beams 850 and 852 of the first embodiment with shear $S_{\alpha 1}$ replaced by shear $S_{\alpha 3}$.

Details of additional angular displacement interferometers are disclosed in PCT Publication WO 00/66969 by Henry A. Hill and published Nov. 9, 2000, the contents of which is incorporated herein by reference, and in U.S. patent application Ser. No. 10/272,034 by Henry A. Hill, filed Oct. 15, 2002 and entitled "INTERFEROMETER FOR MEASURING CHANGES IN OPTICAL BEAM DIRECTIONS."

Referring again to FIG. 2 and FIG. 3, deviations $\beta_x$, $\beta_y$, $\delta_x$, and $\delta_y$ depend on HSPMI 111 and/or measurement object 190. Due to the inhomogeneous nature of the defects giving rise to beam path deviations, deviations $\beta_x$, $\beta_y$, $\delta_x$, and $\delta_y$ can vary for different nominal paths. Moreover, deviations $\beta_x$, $\beta_y$, $\delta_x$, and $\delta_y$ can vary as a function of the propagation direction of the input beam. Accordingly, deviations $\beta_x$, $\beta_y$, $\delta_x$, and $\delta_y$ are parameterized as a function of measurement object displacement relative to the interferometer, the angular orientation of the measurement object, and the input beam propagation direction.

For interferometers used in precision metrology applications, these variations typically change only slowly with time. Thus, these deviations can be determined prior to deployment of the interferometer in its end use application. This data is stored in a representation such as a lookup table, which is accessed when the interference phase data captured using system 100 is to be analyzed. In alternative embodiments, the representation relating the observable parameters to beam deviations can be in the form of a functional representation (e.g., one or more algebraic functions), and the beam deviations can be determined from the parameters using the functions.

In some embodiments, measurement object displacement can be determined using an iterative process. Where the correction data is parameterized by interferometrically determined parameters (e.g., measurement object displacement and/or angular orientation), the system can iterate the parameter and deviation term determination until the system converges on a value for the parameter. For example, where the deviation data is parameterized by measurement object displacement, the system can make an initial determination for the displacement from the measured phase using Eq. (2). Using the initial displacement value, the system then determines the deviation terms from the representation. Using this data, the system recalculates the displacement using Eq. (12) to provide a once-corrected displacement value. The system iterates this procedure by re-determining the deviation terms based on the once-corrected displacement value. This process can be repeated until the corrected displacement suitably converges.

Data relating the observable parameters to deviation angles can be characterized in a calibration procedure prior to installing the interferometer and other components in their end-use application. Deviations $\beta_x$, $\beta_y$, $\delta_x$, and $\delta_y$ can be measured by splitting off a portion of the appropriate beam with a non-polarizing beam splitter, and monitoring the beam direction while scanning the measurement object displacement, orientation angle, and/or direction of the input beam. For example, in order to determine $\beta_x$ or $\beta_y$, a beam-splitter can be positioned in both the first pass and second pass path of the measurement beam to the measurement object. The measurement beam direction is then tracked for each pass by monitoring the direction of the beam directed out of the measurement beam path by the beam-splitter while the system scans the measurement object displacement, orientation angle, and/or input beam direction of the interferometer.

Non-zero values for the deviations $\beta_x$, $\beta_y$, $\delta_x$, and $\delta_y$ arise from imperfections in the interferometer and/or plane mirror measurement object. For example, non-zero values of $\beta_x$ and/or $\beta_y$ can be caused by surface imperfections of the plane mirror measurement object, and can cause a deviation of the first and/or second pass measurement beam from the nominal path. Alternatively, or additionally, imperfections in the optical components making up the interferometer can contribute to $\beta_x$ and/or $\beta_y$ upon either prior to the measurement beam's first pass to the measurement object or between the beam's first and second pass the measurement object.

Beam directions can be monitored interferometrically or non-interferometrically. Examples of suitable interferometers for monitoring beam directions include angle interferometers, such as the angle interferometer described above, and Hartmann-Shack interferometers.

A Hartmann-Shack interferometer utilizes a lenslet array, which is placed in the path of a pair of overlapping beams to be measured. A detector is positioned at the focal plane of the lenslet array. When the beams are coincident and their paths are parallel to the optical axes of the lenslets, the beams are focused to an array of spots also coincident with the lenslet optical axes. However, deviations of one of the beam's direction causes it to be focused to a different location from those corresponding to the undeviated beam. These deviations can be tracked by the detector, and the data can be used to calculate the beam propagation direction based on the properties and location of the lenslet array. Use of Hartmann-Shack interferometers (also termed Hartmann-Shack sensors) in other applications is disclosed, for example, by Liang, J and co-workers in "Objective measurement of wave aberrations of the human eye with the use of a Hartmann-Shack wave-front sensor," J. Opt. Soc. Am. (A), 11, 1949-57 (1994), by J. Liang and D. R. Williams in "Aberrations and retinal image quality of the normal human eye," J. Opt. Soc. Am. (A), 14, 2873-83 (1997), and P. M. Prieto and co-workers in "Analysis of the performance of the Hartmann-Shack sensor in the human eye," J. Opt. Soc. Am. (A), 17, 1388-98 (2000).

Non-interferometric methods of monitoring beam direction include, for example, tracking the beam direction using a pixilated detector array (e.g., a CCD camera). As the beam direction changes, it impinges on different detector elements in the array. By tracking the location of the beam on the array while scanning measurement object displacement, orientation angle, and input beam direction, the system can determine variations of the beam direction as a function of the scanned parameters. When using a pixilated detector array, the optical path of the tracked beam to the detector array should be sufficiently long to provide sufficient angular resolution.

While the aforementioned deviations can be monitored directly using techniques disclosed herein, imperfections in components of the interferometry system can also be characterized in other ways. For example, imperfections in the reflecting surface of the plane mirror measurement object (e.g., variations in the mirror's surface topography) can be accounted for by measuring the mirror's figure, which is a measure of a mirror's surface topography. The figure of each measurement object can be characterized, for example, using a Fizeau interferometer. The figure of the portions of the measurement objects may also be determined by techniques such as described in commonly owned U.S. patent application Ser. No. 09/853,114 entitled "IN-SITU STAGE MIRROR CHARACTERIZATION," filed May 10, 2001, U.S. patent application Ser. No. 10/217,531, also entitled "IN-SITU MIRROR CHARACTERIZATION," filed on Aug. 13, 2002, and U.S. patent application Ser. No. 10/406,749, entitled "METHOD AND APPARATUS FOR STAGE MIRROR MAPPING," filed Apr. 3, 2003, which claims priority to Provisional Patent Application No. 60/371,172 filed on Apr. 9, 2002, with the same title. These applications name Henry Allen Hill as inventor, and the entire contents of each is hereby incorporated by reference.

In embodiments where imperfections in optical components are measured directly, the beam path deviations can be determined from the imperfections using known relationships between the imperfections and beam paths. For example, ray tracing tools can be used to provide beam anticipated beam paths through an interferometer based on, e.g., empirical data related to optical surfaces and bulk imperfections in system components.

During error calibration and/or during use of system 100, $\theta_x$ and $\theta_y$ can be monitored interferometrically or by other methods. Interferometric methods for monitoring an orientation angle of a plane mirror measurement object are well established in the art. One way to interferometrically monitor the angular orientation of a plane mirror measurement object is to use two displacement measuring interferometers (e.g., two HSPMIs). Where the distance between the interferometer measurement axes is known, the interferometers can be used to provide the measurement object orientation within a first plane defined by the measurement axes. Angular orientation of the measurement object in a plane perpendicular to the first plane can be determined by using a third displacement measuring interferometer, wherein the third displacement measuring interferometer is positioned so that its measurement axis and the measurement axis of one of the other interferometers define a plane perpendicular to the first plane. Such multi-axis measurements may be performed using multiple discrete interferometers, such as multiple HSPMIs, or using a multiple axis metrology system that monitors the location of a measurement object in multiple degrees of freedom. Examples of multiple axis metrology systems are disclosed in U.S. Pat. No. 6,313,918, entitled "SINGLE-PASS AND MULTI-PASS INTERFEROMETRY SYSTEMS HAVING A DYNAMIC BEAM-STEERING ASSEMBLY FOR MEASURING DISTANCE, ANGLE, AND DISPERSION," in U.S. patent application Ser. No. 10/352,616, filed Jan. 28, 2003 and entitled "MULTIPLE-PASS INTERFEROMETRY," and in U.S. patent application Ser. No. 10/351,707, filed Jan. 27, 2003 and entitled "MULTIPLE DEGREE OF FREEDOM INTERFEROMETER," all by Henry A. Hill.

Figure 9:
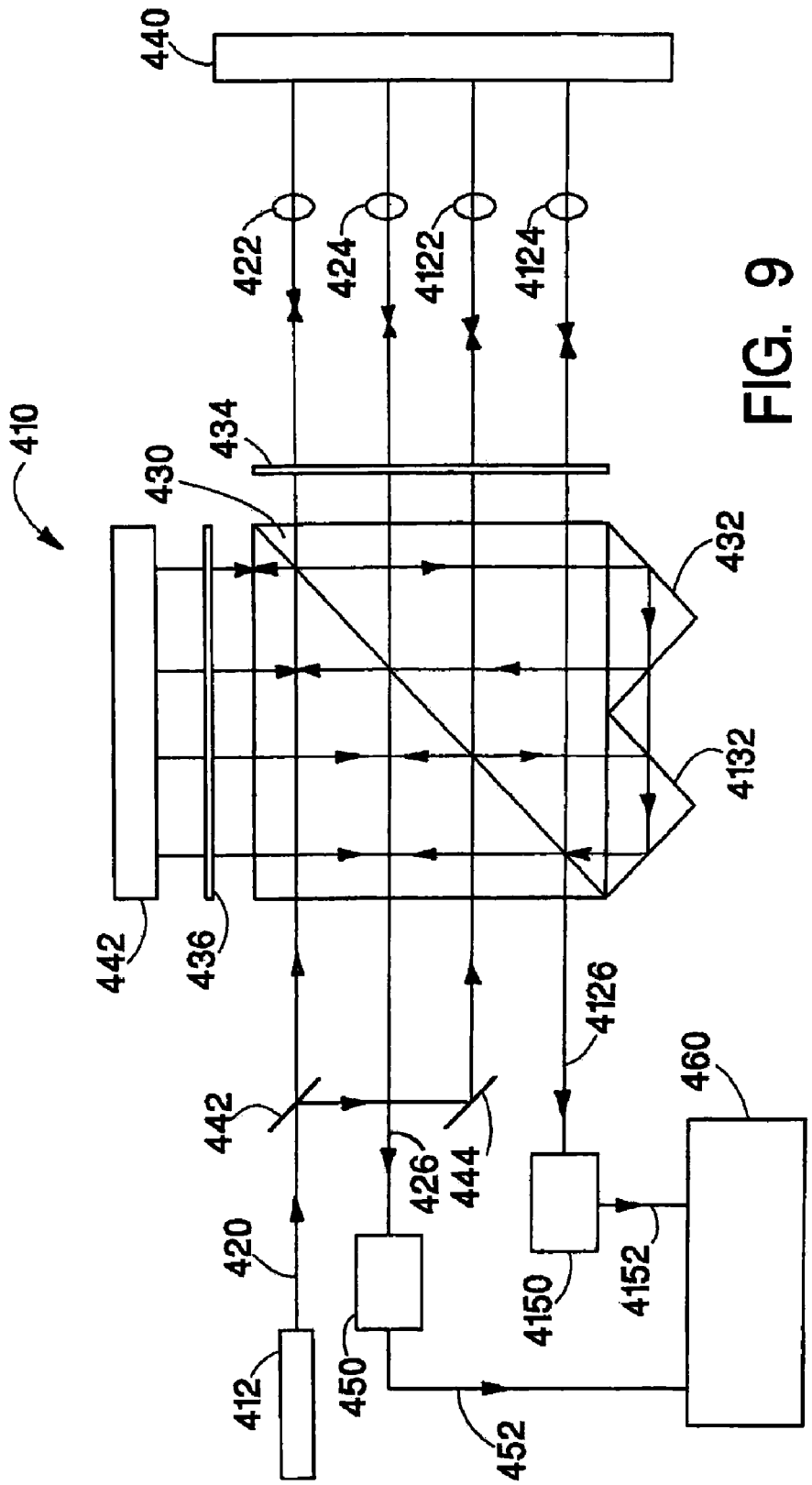
FIG. 9 is a schematic diagram of an embodiment of a multiple degree of freedom interferometer.

Although the foregoing techniques for reducing errors in interferometer 110 are described in detail with respect to an HSPMI, the techniques may be applied to other types of interferometer. For example, the error reducing techniques can be applied to multiple degree of freedom interferometers, such as those referenced above. An example of a multiple degree of freedom interferometer is shown in FIG. 9, which shows an interferometry system 400 that includes interferometer 410, which measures two degrees of freedom of a measurement object 440. Interferometer 410 includes a compound optical assembly that corresponds to two HSPMIs. In addition to interferometer 410, interferometry system 400 further includes a source 412, detectors 450 and 4150, and an electronic processor 460. One HSPMI includes polarization a beam-splitter 430, a retroreflector 432, quarter wave phase retardation plates 434 and 436, and generates first and second pass measurement beams 422 and 424, respectively, and an output beam 426. The second HSPMI includes polarization beam-splitter 430, a retroreflector 4132, quarter wave phase retardation plates 434 and 436, and generates first and second pass measurement beams 4122 and 4124, respectively, and output beam 4126.

Input beam 420 is furnished by source 412. A non-polarizing beam-splitter 442 splits beam 420 into two beams that correspond to the input beam for each HSPMI. A mirror 444 directs the redirected portion of beam 420 back towards interferometer 410.

An electrical interference signal 452 is generated by the detection of output beam 426 in detector 450. Detector 450 comprises a polarizer to mix the reference and measurement beam components of output beam 426 with respect to polarization. Electrical interference signal 452 contains a heterodyne signal having a heterodyne phase $\Phi_1$. A second electrical interference signal 4152 is generated by the detection of output beam 4126 in detector 4150. Detector 4150 comprises a polarizer to mix the reference and measurement beam components of output beam 4126 with respect to polarization. Electrical interference signal 4152 contains a heterodyne signal having a heterodyne phase $\Phi_2$.

Heterodyne phases $\Phi_1$ and $\Phi_2$ can each be represented by equations corresponding to Eqs. (4) and (7). Accordingly, the optical path difference for corresponding to each phase can be determined as in the foregoing description. These optical path differences are directly related to the displacement of the measurement object with respect to the interferometer at two different locations on the measurement object surface. These locations correspond to the midpoints of where beams 422 and 424 and beams 4122 and 4124 contact the surface, respectively.

The two displacement measurements can be used to determine the angular orientation of the measurement object when the distance between the locations where the displacements are measured is known. Because the system accounts for contributions to the optical path difference caused by beam path deviations in the two displacement measurements, the system also accounts for these deviations in the angular orientation measurement.

In some embodiments, interferometer 410 can be used to provide measurements of the angular orientation of the measurement object used to look-up the appropriate beam deviation data and determine the displacement of the measurement object with respect to the interferometer. In other words, such angular orientation measurements can be used to determine $\theta_x$ and $\theta_y$, and to determine appropriate values for $\zeta$, $\eta_x$, and $\eta_y$ in Eq. (12).

In the foregoing embodiments, the optical path difference between the measurement and reference beams is directly related to the displacement of the measurement object relative to the interferometer. However, in other embodiments, the error correction techniques described herein can be applied to interferometers in which the optical path difference is directly related to other degrees of freedom of the interferometry system. For example, in some embodiments, the optical path difference can be directly related to the angular orientation of the measurement object. Such embodiments include interferometers where instead of only the measurement beam (not the reference beam) contacting the measurement object, both beams are directed to contact the measurement object but at difference locations. In such a configuration, the phase is directly related to an angular orientation of the measurement object in the plane defined by the two beam paths. Examples of such interferometers are described aforementioned U.S. patent application Ser. No. 10/351,708, entitled "MULTI-AXIS INTERFEROMETER," filed Jan. 27, 2003, by Henry A. Hill.

The type of analysis described previously for an HSPMI can be applied to these other types of interferometer. In general, one can determine a relationship corresponding to Eq. (12) based on the geometric configuration of the interferometer, and the system can subsequently determine the angular orientation (or other degree of freedom) of the measurement object from interferometric phase measurements based on the relationship.

More generally, examples of other forms of interferometers that may utilize the error correction techniques disclosed herein include both single and multiple pass interferometers (the HSPMI is a double pass interferometer), and include passive interferometers, dynamic interferometers, and dispersion interferometers. Alternatively, or additionally, the error correction techniques can be applied to interferometers that monitor more than one degree of freedom, interferometers that monitor variations in angular orientation of a measurement object, and angular displacement interferometers that measure beam propagation direction.

Examples of dynamic interferometers are described in U.S. patent application Ser. No. 10/226,591 filed Aug. 23, 2002 and entitled "DYNAMIC INTERFEROMETER CONTROLLING DIRECTION OF INPUT BEAM" by Henry A. Hill. Examples of passive zero shear interferometers are described in U.S. patent application Ser. No. 10/207,314, entitled "PASSIVE ZERO SHEAR INTERFEROMETERS," filed Jul. 29, 2002, by Henry A. Hill. Examples of angular displacement interferometers are described in: U.S. patent application Ser. No. 10/226,591 entitled "DYNAMIC INTERFEROMETER CONTROLLING DIRECTION OF INPUT BEAM," filed Aug. 23, 2002; U.S. Provisional Application No. 60/314,345 filed Aug. 22, 2001 and entitled "PASSIVE ZERO SHEAR INTERFEROMETERS USING ANGLE SENSITIVE BEAM-SPLITTERS," both by Henry A. Hill, and U.S. patent application Ser. No. 10/272,034 entitled "INTERFEROMETERS FOR MEASURING CHANGES IN OPTICAL BEAM DIRECTION" and filed Oct. 15, 2002 by Henry A. Hill and Justin Kreuzer. Alternatively, or additionally, interferometry systems may include one or more differential angular displacement interferometers, examples of which are also described in U.S. patent application Ser. No. 10/272,034. Examples of interferometry systems for measuring more than one degree of freedom and for reducing beam shear are described in U.S. patent application Ser. No. 10/352,616 filed Jan. 28, 2003 and entitled "MULTIPLE-PASS INTERFEROMETRY" by Henry A. Hill. Other forms of multiple pass interferometers are described in an article entitled "Differential interferometer arrangements for distance and angle measurements: Principles, advantages and applications" by C. Zanoni, VDI Berichte Nr. 749, 93-106 (1989). Examples of two-wavelength dispersion interferometers are described in U.S. Pat. No. 6,219,144 B1 entitled "APPARATUS AND METHOD FOR MEASURING THE REFRACTIVE INDEX AND OPTICAL PATH LENGTH EFFECTS OF AIR USING MULTIPLE-PASS INTERFEROMETRY" by Henry A. Hill, Peter de Groot, and Frank C. Demarest and U.S. Pat. No. 6,327,039 B1 by Peter de Groot, Henry A. Hill, and Frank C. Demarest.

The interferometry systems described herein provide highly accurate measurements. Such systems can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see, for example, the *Semiconductor Industry Roadmap*, p. 82 (1997).

Overlay depends directly on the performance, i.e., accuracy and precision, of the distance measuring interferometers used to position the wafer and reticle (or mask) stages. Since a lithography tool may produce $50-100M/year of product, the economic value from improved performance distance measuring interferometers is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithog-* raphy: Science and Technology (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 10:
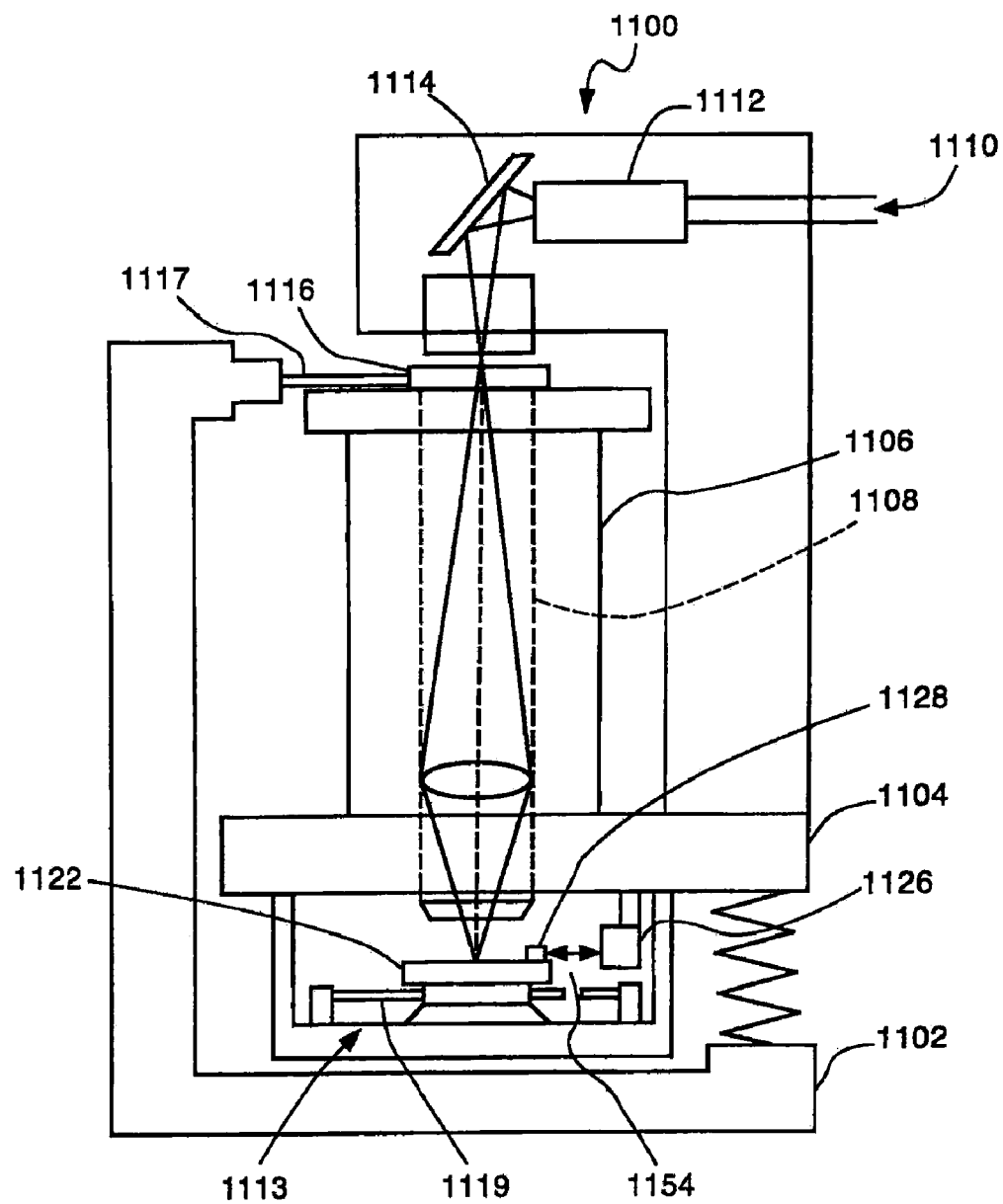
FIG. 10 is a schematic diagram of an embodiment of a lithography tool that includes an interferometer.

An example of a lithography scanner 1100 using an interferometry system 1126 is shown in FIG. 10. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 11A:
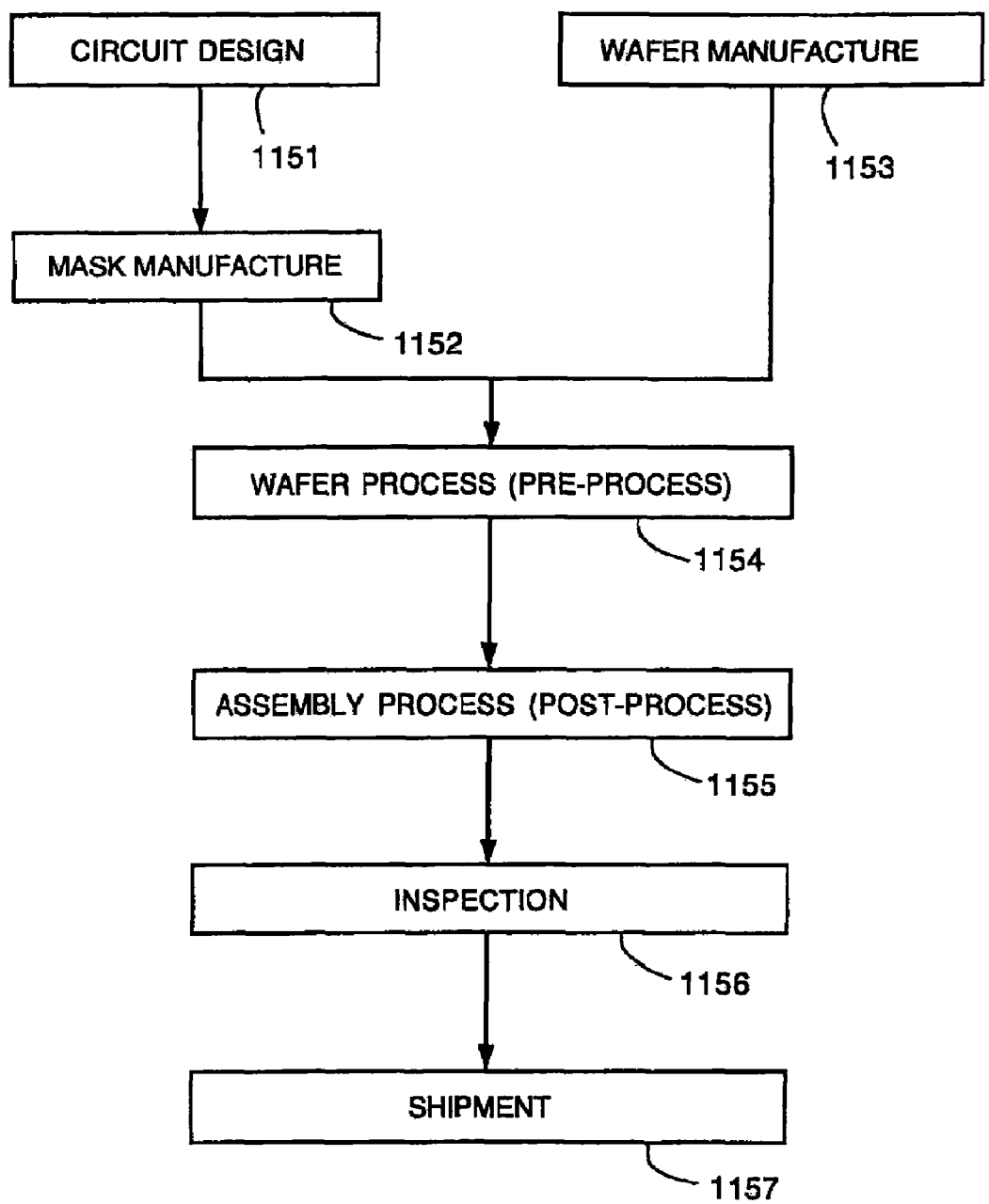
FIG. 11(a) and FIG. 11(b) are flow charts that describe steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 11(a) and 11(b). FIG. 11(a) is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 11B:
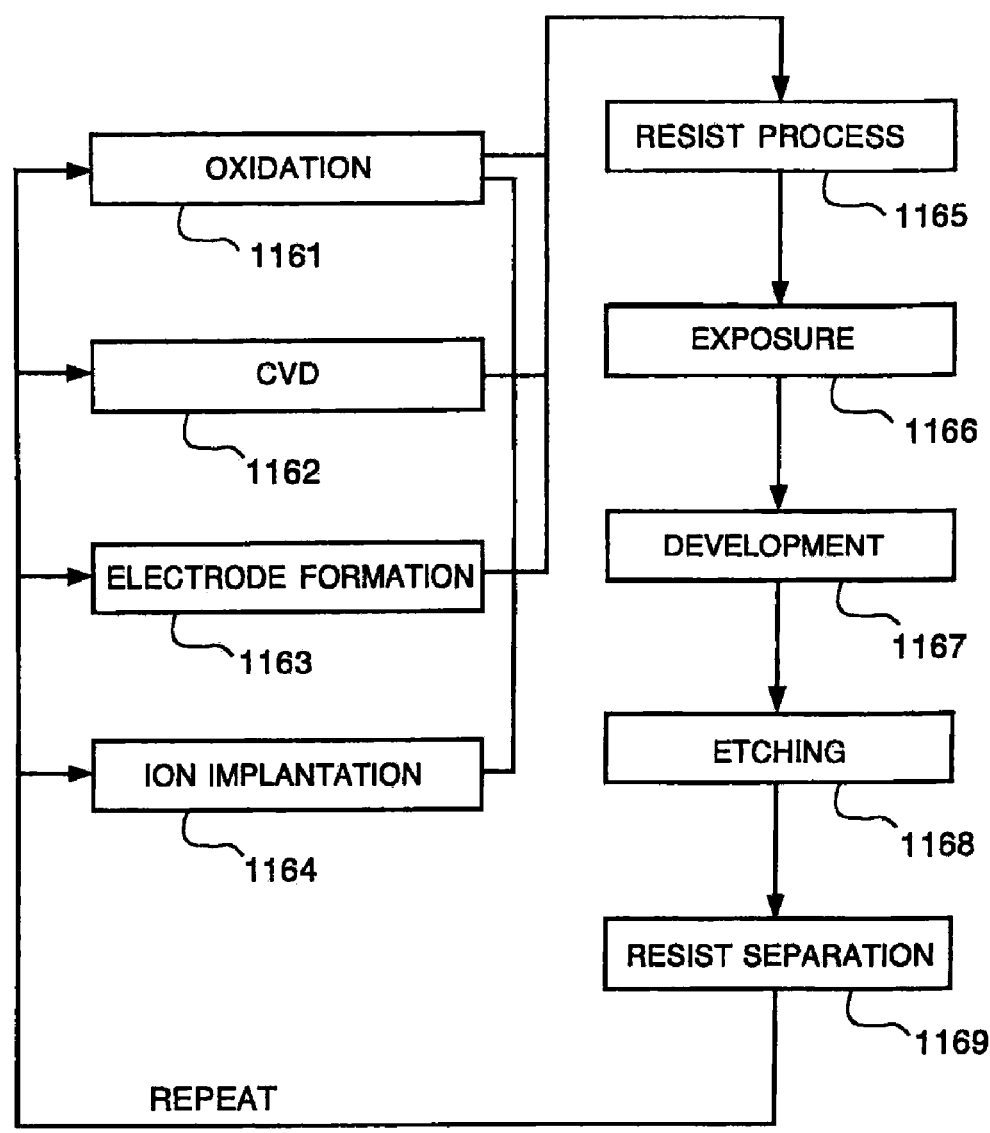

FIG. 11(b) is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 12:
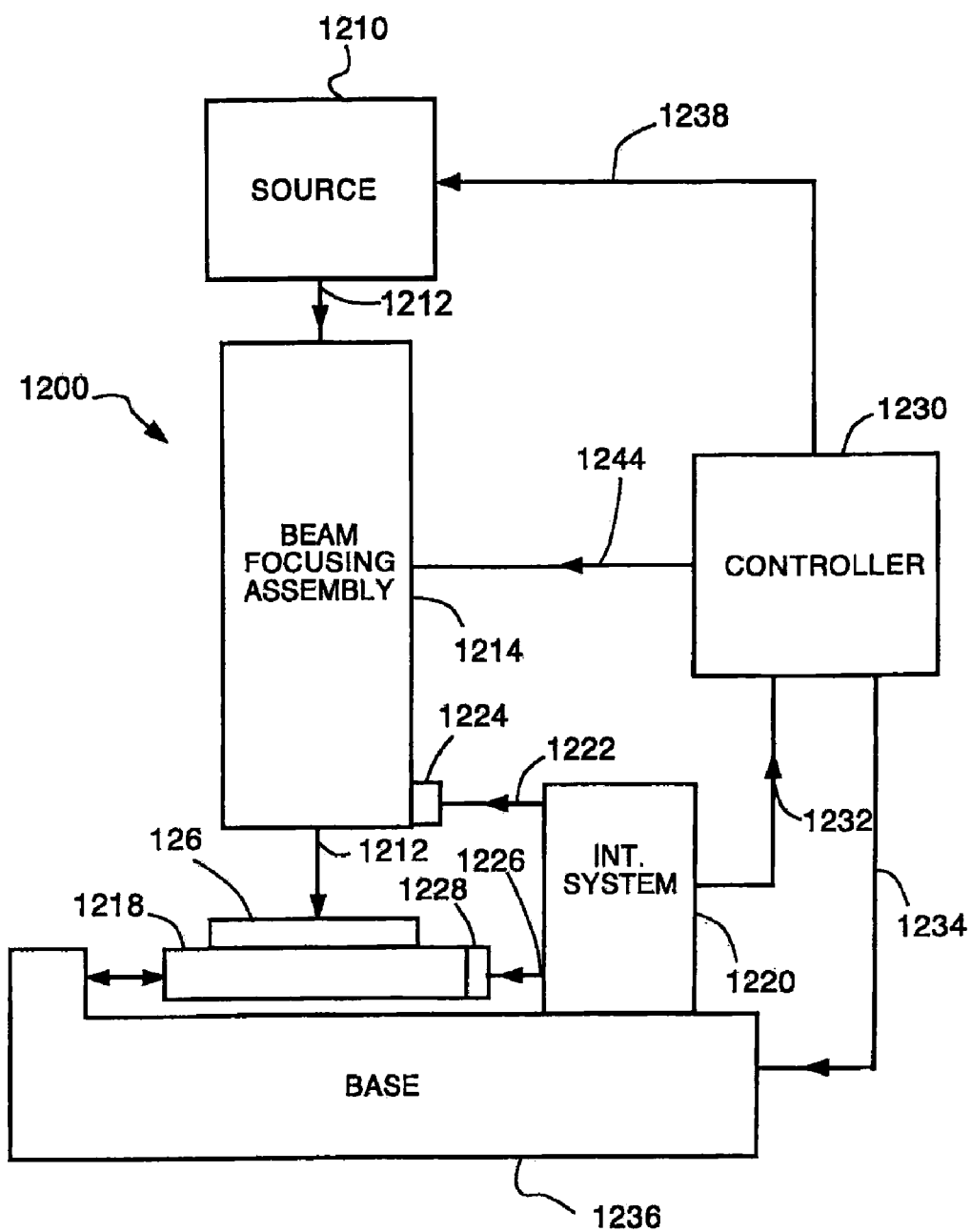
FIG. 12 is a schematic of a beam writing system that includes an interferometry system.

As an example, a schematic of a beam writing system 1200 is shown in FIG. 12. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. Accordingly, other embodiments are within the scope of the following claims.

What is claimed is:

1. A method comprising:

using an interferometer in an interferometry system to produce an output beam comprising a phase related to an optical path difference between paths of two beams, at least one of which contacts a measurement object in the interferometry system, wherein the two beams are derived from an input beam and the interferometer comprises interferometer optics spaced from the measurement object;

providing precalibrated information that accounts for contributions to the optical path difference caused by a deviation of at least one of the beam paths from a nominal beam path due to an imperfection in at least one of the interferometer optics or an imperfection in a light source used to produce the input beam;

determining a position of the measurement object with respect to at least one degree of freedom based on information derived from the output beam and the precalibrated information; and moving the measurement object with respect to the interferometer based on the determined position.

2. The method of claim 1, wherein the imperfection in at least one optic of the interferometer comprises an imperfection in a surface of the optic.

3. The method of claim 1, wherein the imperfection in at least one optic of the interferometer comprises a bulk imperfection in the optic.

4. The method of claim 1, wherein the imperfection in the light source causes the input beam to deviate from an input beam path to the interferometer.

5. The method of claim 1, wherein the precalibrated information is parameterized in terms of at least one of an angular orientation of the measurement object relative to the interferometer, a distance between the measurement object and the interferometer, and a direction of an input beam to the interferometer.

6. The method of claim 5, wherein the precalibrated information is parameterized in terms of at least two of an angular orientation of the measurement object relative to the interferometer, a distance between the measurement object and the interferometer, and a direction of an input beam to the interferometer.

7. The method of claim 6, wherein the precalibrated information is parameterized in terms of an angular orientation of the measurement object relative to the interferometer, a distance between the measurement object and the interferometer, and a direction of an input beam to the interferometer.

8. The method of claim 5, wherein the precalibrated information is stored as a representation in an electronic storage medium.

9. The method of claim 8, wherein the representation comprises a lookup table.

10. The method of claim 8, wherein the representation comprises a functional representation.

11. The method of claim 1, wherein the determined position of the measurement object with respect to at least one degree of freedom is related to a displacement of the measurement object relative to the interferometer.

12. The method of claim 11, wherein the determined position of the measurement object with respect to at least one degree of freedom is the displacement of the measurement object relative to the interferometer.

13. The method of claim 1, wherein the determined position of the measurement object with respect to at least one degree of freedom is related to an angular orientation of the measurement object.

14. The method of claim 13, wherein the determined position of the measurement object with respect to at least one degree of freedom is the angular orientation of the measurement object.

15. The method of claim 1, wherein determining the position of the measurement object comprises measuring the phase of the output beam and relating the phase to the position of the measurement object based on one or more values derived from the predetermined information.

16. The method of claim 15, wherein the values derived from the predetermined information are selected based on the phase.

17. The method of claim 15, wherein the values derived from the predetermined information are selected based on an angular orientation of the measurement object.

18. The method of claim 15, wherein the values derived from the predetermined information are selected based on a path of an input beam derived from the light source to the interferometer relative to the nominal path.

19. The method of claim 18, further comprising monitoring deviations of the input beam path from the nominal path.

20. The method of claim 15, wherein a relationship between the phase, Φ, and the optical path difference can be expressed by the equation $$\Phi = 2pkL\zeta(1-(\theta-\eta)^2),$$

wherein p is an integer, k is a wavenumber, L is a relative distance between the interferometer and the measurement object, θ is an angular orientation of the measurement object with respect to the interferometer, and ζ and η are terms that depend on the deviation of at least one of the beam paths from the nominal beam path.

21. The method of claim 1, wherein using the interferometer to produce the output beam comprises producing the output beam as the measurement object is moved relative to the interferometer, and wherein determining the position of the measurement object comprises monitoring the position of the measurement object during the relative movement.

22. The method of claim 1, wherein using the interferometer to produce the output beam comprises separating the input beam into at least two beams, directing the two beam along the two beam paths, and recombining the two beams after at least one of the beams contacts the measurement object.

23. The method of claim 22, wherein both beam paths contact the measurement object.

24. The method of claim 23, wherein the optical path difference is related to an angular orientation of the measurement object with respect to the interferometer.

25. A method comprising:
using an interferometer to produce an output beam comprising a phase related to an optical path difference between two beam paths, at least one of which contacts a measurement object, the interferometer comprising interferometer optics spaced from the measurement object;

providing precalibrated information that accounts for contributions to the optical path difference caused by a deviation of at least one of the beam paths from a nominal beam path due to an imperfection in at least one of a light source for the interferometer and at least one of the interferometer optics;
determining a displacement of the measurement object relative to the interferometer based on the precalibrated information and information derived from the output beam; and
moving the measurement relative to the interferometer based on the determined displacement.

26. A method comprising:
correcting interferometric measurements of a position of a measurement object made by an interferometry system including an interferometer comprising interferometer optics based on precalibrated information that accounts for contributions to an optical path difference caused by a deviation of at least one beam path from a nominal beam path due to an imperfection in at least one of the interferometer optics or an imperfection in a light source from which the beam is derived, the interferometer being configured to direct a beam along the at least one beam path to reflect from a measurement object spaced from the interferometer optics; and
adjusting the position of the measurement object based on the corrected interferometric measurement.

27. A lithography method for use in fabricating integrated circuits on a wafer, the method comprising:
supporting the wafer on a moveable stage;
imaging spatially patterned radiation onto the wafer;
adjusting the position of the stage; and
monitoring the position of the stage using the method of claim 26.

28. A method for fabricating integrated circuits, the method comprising:
applying a resist to a wafer;
forming a pattern of a mask in the resist by exposing the wafer to radiation using the lithography method of claim 27; and
producing an integrated circuit from the wafer.

29. A lithography method for use in the fabrication of integrated circuits comprising:
directing input radiation through a mask to produce spatially patterned radiation;
positioning the mask relative to the input radiation;
monitoring the position of the mask relative to the input radiation using the method of claim 26; and
imaging the spatially patterned radiation onto a wafer.

30. A method for fabricating integrated circuits, the method comprising:
applying a resist to a wafer;
forming a pattern of a mask in the resist by exposing the wafer to radiation using the lithography method of claim 29; and
producing an integrated circuit from the wafer.

31. A lithography method for fabricating integrated circuits on a wafer comprising:
positioning a first component of a lithography system relative to a second component of a lithography system to expose the wafer to spatially patterned radiation; and
monitoring the position of the first component relative to the second component using the method of claim 26.

32. A method for fabricating integrated circuits, the method comprising:
applying a resist to a wafer;

forming a pattern of a mask in the resist by exposing the wafer to radiation using the lithography method of claim 31; and producing an integrated circuit from the wafer.

33. A method for fabricating a lithography mask, the method comprising:

directing a write beam to a substrate to pattern the substrate;

positioning the substrate relative to the write beam; and monitoring the position of the substrate relative to the write beam using the interferometry method of claim 26.

34. A method comprising:

calibrating an interferometry system comprising an interferometer including interferometer optics by determining information that accounts for contributions to an optical path difference caused by a deviation of at least one beam path from a nominal beam path due to an imperfection in at least one of the interferometer optics or an imperfection in a light source from which the beam is derived, the interferometer being configured to direct a beam along the at least one beam path to reflect from a measurement object spaced from the interferometer optics; and moving the measurement object relative to the interferometer based on measurements of the position of the measurement object made using the calibrated interferometry system.

35. The method of claim 34, wherein the calibrating comprises monitoring changes in a direction of one or more intermediate beams in the interferometry system while varying the optical path difference.

36. The method of claim 35, wherein the varying of the optical path difference comprises displacing a measurement object relative to an interferometer in the interferometry system.

37. The method of claim 35, wherein the varying of the optical path difference comprises changing an angular orientation of a measurement object relative to an interferometer in the interferometry system.

38. An apparatus comprising:

an interferometer configured to produce an output beam comprising a phase related to an optical path difference between two beam paths, at least one of which contacts a measurement object, wherein the interferometer comprises interferometer optics spaced from the interferometer; and an electronic controller coupled to the interferometer, wherein during operation the electronic controller determines a position of the measurement object with respect to at least one degree of freedom based on information derived from the output beam and precalibrated information that accounts for contributions to the optical path difference caused by a deviation of at least one of the beam paths from a nominal beam path due to an imperfection in at least one of a light source for the interferometer or at least one of the interferometer optics.

39. A lithography system for use in fabricating integrated circuits on a wafer, the system comprising:

a stage for supporting the wafer;

an illumination system for imaging spatially patterned radiation onto the wafer;

a positioning system for adjusting the position of the stage relative to the imaged radiation; and the apparatus of claim 38 for monitoring the position of the wafer relative to the imaged radiation.

40. A lithography system for use in fabricating integrated circuits on a wafer, the system comprising:

a stage for supporting the wafer; and an illumination system including a radiation source, a mask, a positioning system, a lens assembly, and the apparatus of claim 38, wherein during operation the source directs radiation through the mask to produce spatially patterned radiation, the positioning system adjusts the position of the mask relative to the radiation from the source, the lens assembly images the spatially patterned radiation onto the wafer, and the apparatus monitors the position of the mask relative to the radiation from the source.

41. A beam writing system for use in fabricating a lithography mask, the system comprising:

a source providing a write beam to pattern a substrate;

a stage supporting the substrate;

a beam directing assembly for delivering the write beam to the substrate;

a positioning system for positioning the stage and beam directing assembly relative one another; and the apparatus of claim 38 for monitoring the position of the stage relative to the beam directing assembly.

42. An apparatus comprising an electronic storage medium storing precalibrated information that accounts for contributions to an optical path difference caused by a deviation of at least one beam path from a nominal beam path due to an imperfection in at least one of a light source for an interferometer or optics of the interferometer, the interferometer being configured to direct a beam along one of the beam paths to reflect from a measurement object spaced from the interferometer optics.

* * * * *